US012564085B2

(12) United States Patent
Atadana et al.

(10) Patent No.: US 12,564,085 B2
(45) Date of Patent: Feb. 24, 2026

(54) MICROELECTRONIC ASSEMBLY WITH UNDERFILL FLOW CONTROL

(71) Applicant: Intel Corporation, Santa Clara, CA (US)

(72) Inventors: Frederick Atadana, Hillsboro, OR (US); Jean Bosco Kana Kana, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 685 days.

(21) Appl. No.: 17/750,825

(22) Filed: May 23, 2022

(65) Prior Publication Data

US 2023/0378124 A1     Nov. 23, 2023

(51) Int. Cl.
*H01L 23/00*          (2006.01)
*H01L 25/065*         (2023.01)

(52) U.S. Cl.
CPC .............. *H01L 24/83* (2013.01); *H01L 24/26* (2013.01); *H01L 24/29* (2013.01); *H01L 24/32* (2013.01);
(Continued)

(58) Field of Classification Search
CPC ......... H01L 24/83; H01L 24/26; H01L 24/29; H01L 24/32; H01L 24/73; H01L 24/92; H01L 24/13; H01L 24/14; H01L 24/16; H01L 24/81; H01L 25/0655; H01L 2224/14152; H01L 2224/16225; H01L 2224/26122; H01L 2224/2919; H01L 2224/2929; H01L 2224/29386; H01L 2224/32225; H01L 2224/73204; H01L 2224/81203; H01L 2224/81815; H01L 2224/83009; H01L 2224/83102; H01L 2224/83375; H01L 2224/83379; H01L 2224/8385; H01L 2224/92125; H01L 2924/05442; H01L 2924/0665; H01L 21/563
See application file for complete search history.

(56) References Cited

U.S. PATENT DOCUMENTS 10,796,975 B2     10/2020  Mao
2020/0006169 A1    1/2020  Warren et al.
(Continued)

OTHER PUBLICATIONS

Teo, M., et al., "Plasma Surface Modification and Impact on MSL Performance for Flip Chip Packaging", 9th Electronics Packaging Technology Conference, Singapore, 2007.
(Continued)

*Primary Examiner* — Douglas W Owens
(74) *Attorney, Agent, or Firm* — Essential Patents Group, LLP

(57) ABSTRACT

A microelectronic assembly comprises a first microelectronic component; a second microelectronic component under an area of the first microelectronic component and coupled to the first component through first interconnect structures within a central region of the area, and second interconnect structures within a peripheral region of the area, adjacent to the central region. A heterogenous dielectric surface on the first or second component or both and within a gap between the first and second components has a first surface composition within the central region and at least a second surface composition within the peripheral region.

25 Claims, 16 Drawing Sheets

(52) U.S. Cl.
CPC ............... *H01L 24/73* (2013.01); *H01L 24/92* (2013.01); *H01L 24/13* (2013.01); *H01L 24/14* (2013.01); *H01L 24/16* (2013.01); *H01L 24/81* (2013.01); *H01L 25/0655* (2013.01); *H01L 2224/13111* (2013.01); *H01L 2224/13147* (2013.01); *H01L 2224/14152* (2013.01); *H01L 2224/16225* (2013.01); *H01L 2224/26122* (2013.01); *H01L 2224/2919* (2013.01); *H01L 2224/2929* (2013.01); *H01L 2224/29386* (2013.01); *H01L 2224/32225* (2013.01); *H01L 2224/73204* (2013.01); *H01L 2224/81203* (2013.01); *H01L 2224/81815* (2013.01); *H01L 2224/83009* (2013.01); *H01L 2224/83102* (2013.01); *H01L 2224/83375* (2013.01); *H01L 2224/83379* (2013.01); *H01L 2224/8385* (2013.01); *H01L 2224/92125* (2013.01); *H01L 2924/05442* (2013.01); *H01L 2924/0665* (2013.01)

(56) References Cited

U.S. PATENT DOCUMENTS

| | | | |
|---|---|---|---|
| 2021/0202442 A1 | 7/2021 | Khalaf | |
| 2021/0343677 A1* | 11/2021 | Atadana | H01L 23/293 |
| 2023/0395564 A1* | 12/2023 | Huang | H01L 23/04 |

OTHER PUBLICATIONS

Wikipedia, "Flip chip", https://en.wikipedia.org/wiki/Flip_chip; Apr. 21, 2022.

Zhao, J., et al., "Plasma for Underfill Process in Flip Chip Packaging", Published by Nordson March, www.nordsonmarch.com, 2015.

* cited by examiner

FIG. 6
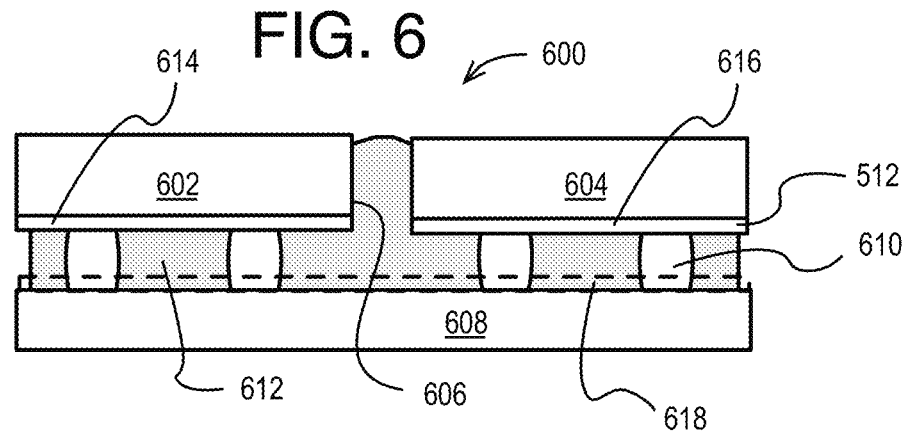
FIG. 7A
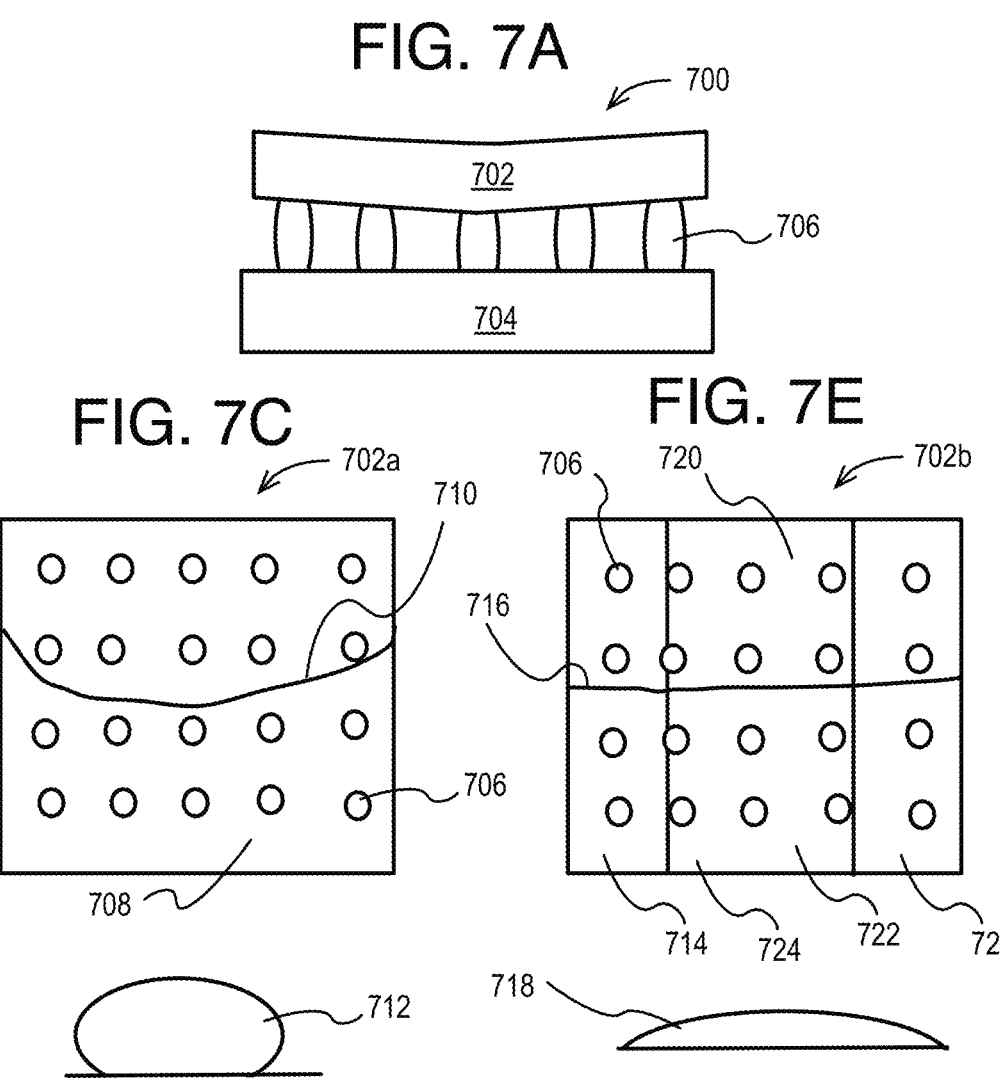
FIG. 7C
FIG. 7E
FIG. 7B
FIG. 7D

FIG. 8A
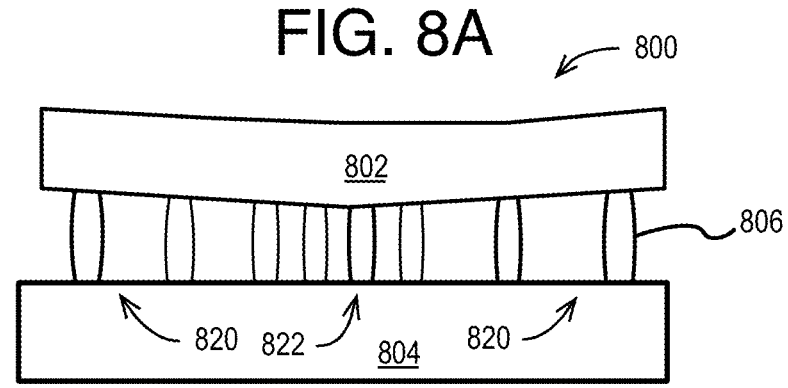
FIG. 8C
FIG. 8E
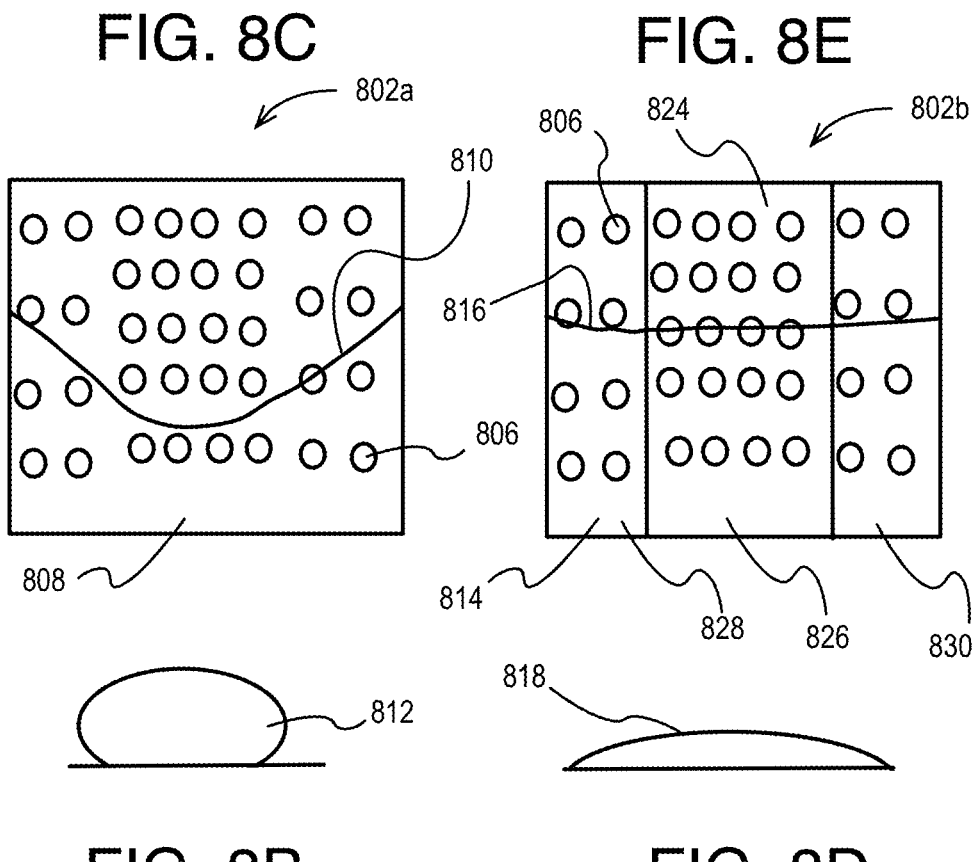
FIG. 8B
FIG. 8D

FIG. 9A
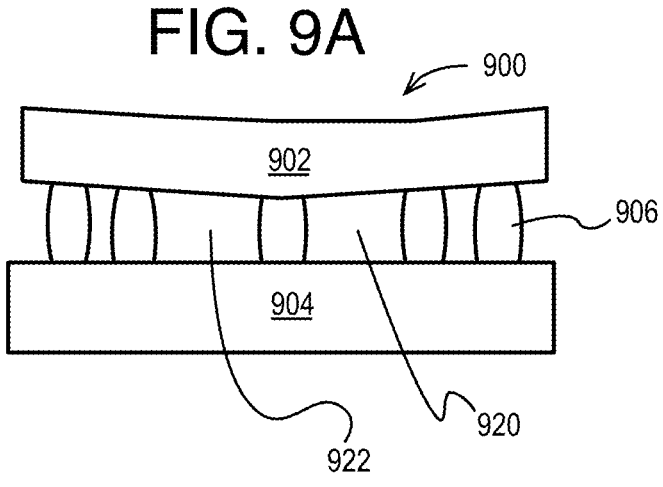
FIG. 9C
FIG. 9E
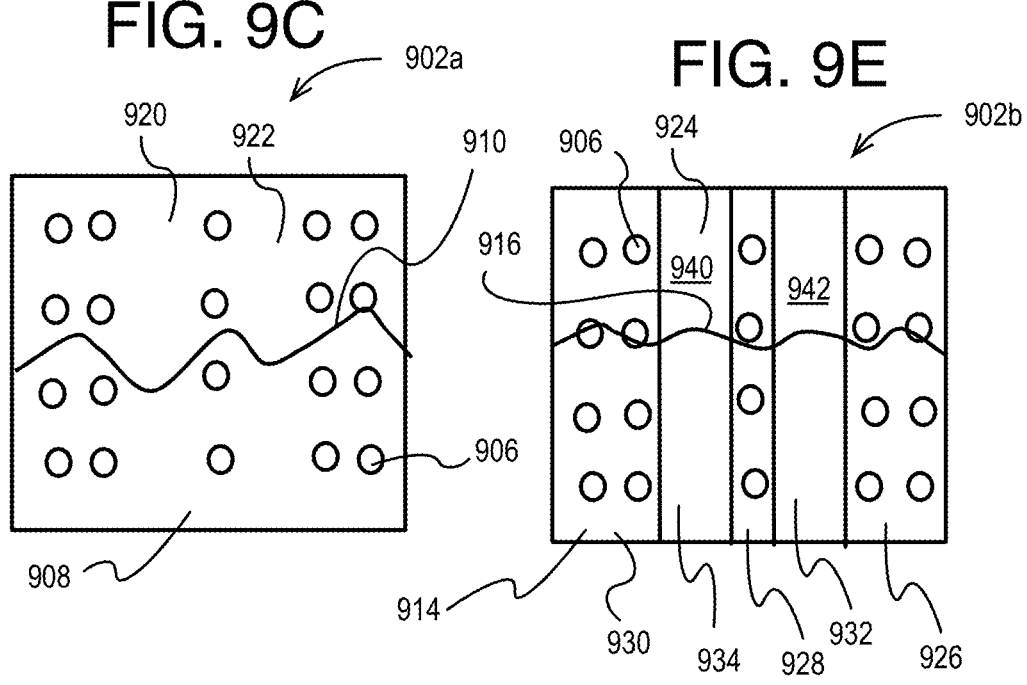
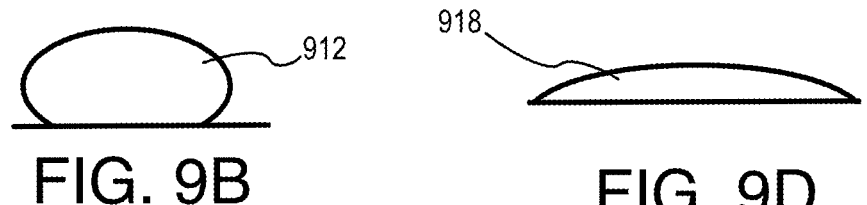
FIG. 9B
FIG. 9D

FIG. 12A     1200

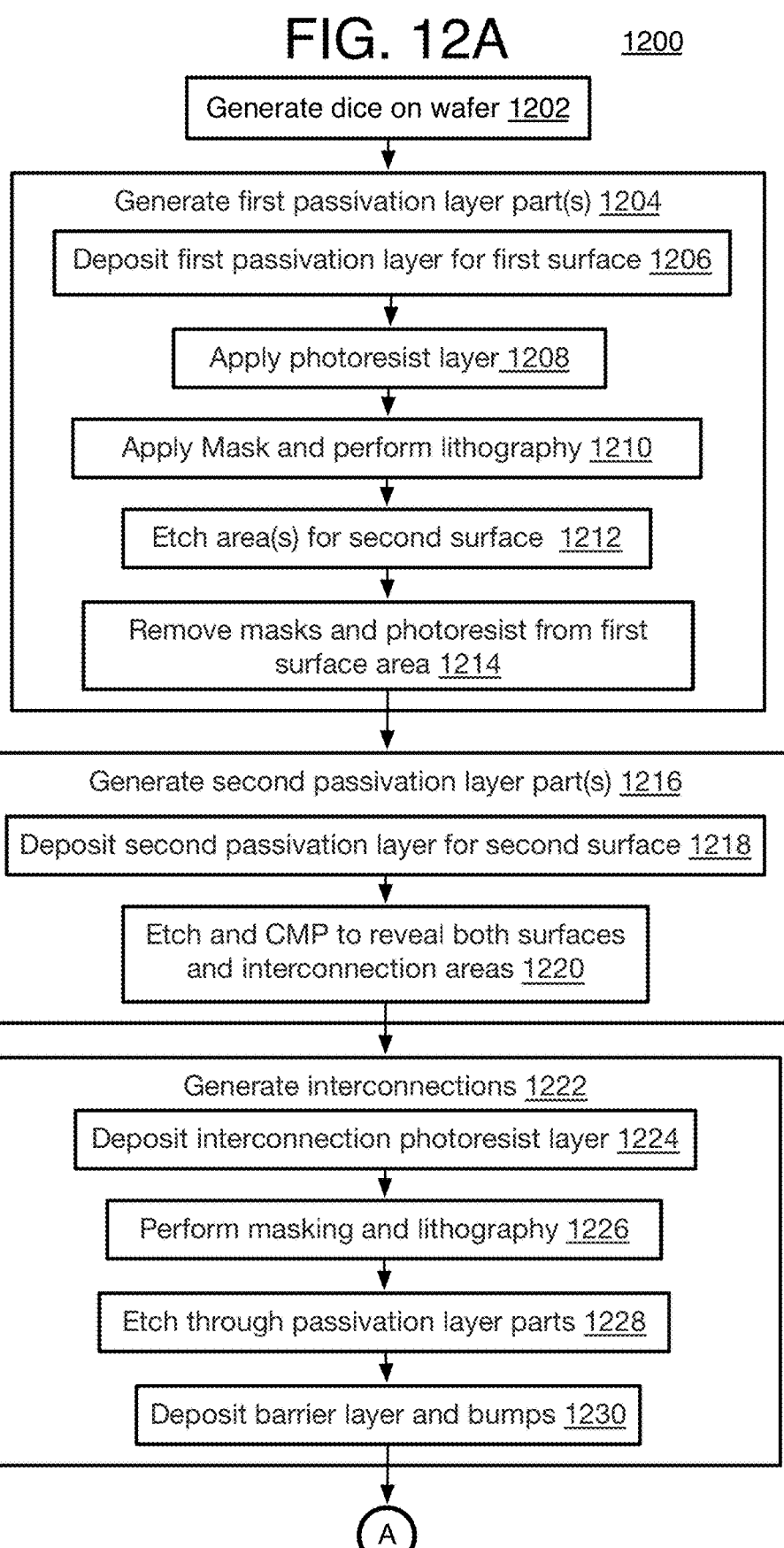

Generate dice on wafer 1202

Generate first passivation layer part(s) 1204

Deposit first passivation layer for first surface 1206

Apply photoresist layer 1208

Apply Mask and perform lithography 1210

Etch area(s) for second surface 1212

Remove masks and photoresist from first surface area 1214

Generate second passivation layer part(s) 1216

Deposit second passivation layer for second surface 1218

Etch and CMP to reveal both surfaces and interconnection areas 1220

Generate interconnections 1222

Deposit interconnection photoresist layer 1224

Perform masking and lithography 1226

Etch through passivation layer parts 1228

Deposit barrier layer and bumps 1230

A

MICROELECTRONIC ASSEMBLY WITH UNDERFILL FLOW CONTROL

BACKGROUND 3D microelectronic assemblies typically have a microelectronic stack of components, such as a stack of dice on a package substrate. When controlled collapse chip connection (C4) or flip-chips are used, the components are coupled together by couplings such as solder bumps between the components so that a gap is formed between adjacent stacked components. The gap is typically filled during manufacture with an underfill for several reasons. For example, the underfill may reduce mechanical stress due to differences in coefficients of thermal expansion that can cause cracking, delamination, or other mechanical failures to the components and couplings while the assembly is heated or cooled. Also, the underfill prevents warping of components when the manufacturing process hammers or presses on upper components, such as during thermocompression bonding (TCB). In addition, the underfill may cover and protect the couplings between components (e.g., the solder bumps), provide a stronger mechanical connection between the components, and may act as a heat bridge. The flow of the underfill, however, may be uneven while using a capillary force technique to place the underfill in the gap, and this often results in voids within the gap that can result in mechanical failures and unreliable die-to-die coupling.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 6 is a schematic diagram of a cross-sectional side view of a microelectronic assembly with underfill between dice and a wafer according to at least one of the implementations described herein;

FIG. 7A is a schematic diagram of a cross-sectional side view of an example first microelectronic assembly;

FIG. 7B is a schematic diagram of a side view of an underfill dispense line used to flow underfill onto the first microelectronic assembly of FIG. 7A using conventional flow;

FIG. 7C is a schematic diagram of a top see-through view of the first microelectronic assembly of FIG. 7A with the conventional flow;

FIG. 7D is a schematic diagram of a side view of an underfill dispense line used to flow underfill onto the first microelectronic assembly of FIG. 7A with a controlled underfill flow according to at least one of the implementations described herein;

FIG. 7E is a schematic diagram of a top see-through view of the first microelectronic assembly of FIG. 7A with a controlled underfill flow according to at least one of the implementations described herein;

FIG. 8A is a schematic diagram of a cross-sectional side view of an example second microelectronic assembly;

FIG. 8B is a schematic diagram of a side view of an underfill dispense line used to flow underfill onto the second microelectronic assembly of FIG. 8A using conventional flow;

FIG. 8C is a schematic diagram of a top see-through view of the second microelectronic assembly of FIG. 8A with the conventional flow;

FIG. 8D is a schematic diagram of a side view of an underfill dispense line used to flow underfill onto the second microelectronic assembly of FIG. 8A with a controlled underfill flow according to at least one of the implementations described herein;

FIG. 8E is a schematic diagram of a top see-through view of the second microelectronic assembly of FIG. 8A with a controlled underfill flow according to at least one of the implementations described herein;

FIG. 9A is a schematic diagram of a cross-sectional side view of an example third microelectronic assembly;

FIG. 9B is a schematic diagram of a side view of an underfill dispense line used to flow underfill onto the third microelectronic assembly of FIG. 9A using conventional flow;

FIG. 9C is a schematic diagram of a top see-through view of the third microelectronic assembly of FIG. 9A with the conventional flow;

FIG. 9D is a schematic diagram of a side view of an underfill dispense line used to flow underfill onto the third microelectronic assembly of FIG. 9A with a controlled underfill flow according to at least one of the implementations described herein;

FIG. 9E is a schematic diagram of a top see-through view of the third microelectronic assembly of FIG. 9A with a controlled underfill flow according to at least one of the implementations described herein;

FIGS. 12A-12B is an example flow chart of fabricating a microelectronic assembly according to at least one of the implementations described herein;

DETAILED DESCRIPTION

Figure 1:
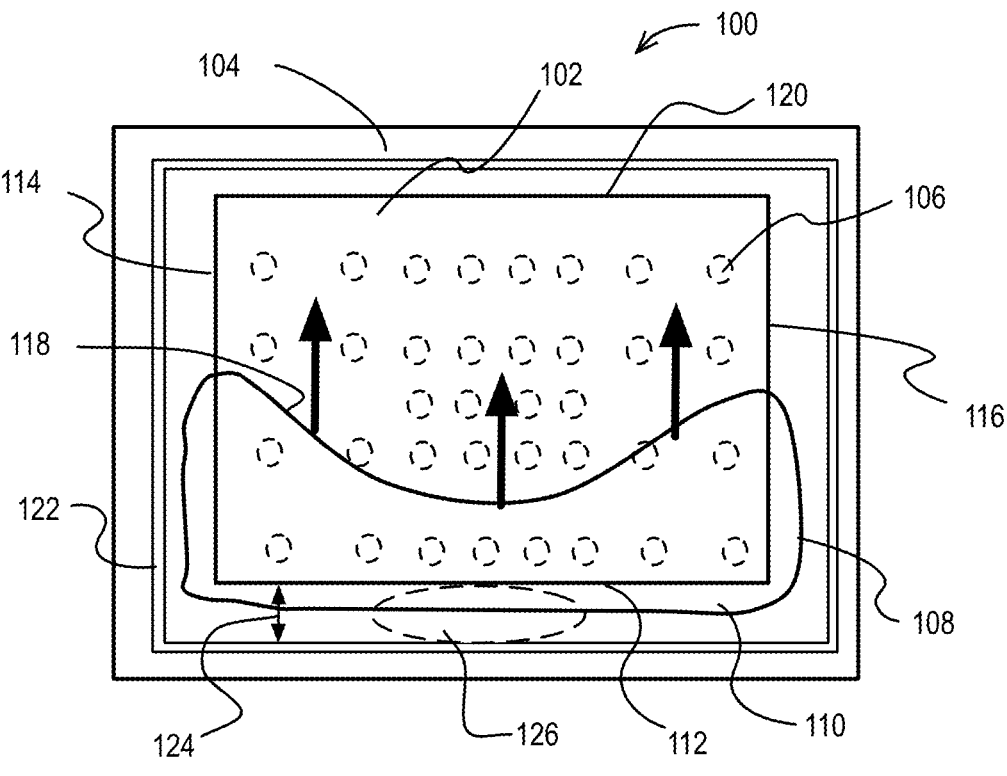
FIG. 1 is a schematic diagram of a top see-through view of a microelectronic assembly with a conventional underfill flow between a die and another electronic component.

One or more implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other implementations may be utilized, and structural and/or logical changes may be made without departing from the scope of claimed subject matter. It should also be noted that directions and references, for example, up, down, top, bottom, over, under, and so on, may be used to facilitate the discussion of the drawings and implementations and are not intended to restrict the application of claimed subject matter. Therefore, the following detailed description is not to be taken in a limiting sense, and the scope of claimed subject matter is defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an implementation" or "one implementation" means that a particular feature, structure, function, or characteristic described in connection with the implementation is included in at least one implementation of the invention. Thus, the appearances of the phrase "in an implementation" or "in one implementation" in various places throughout this specification are not necessarily referring to the same implementation of the invention. Furthermore, the particular features, structures, functions, or characteristics may be combined in any suitable manner in one or more implementations. For example, a first implementation may be combined with a second implementation anywhere the particular features, structures, functions, or characteristics associated with the two implementations are not mutually exclusive.

As used in the description of the invention and the appended claims, the singular forms "a", "an" and "the" are intended to include the plural forms as well, unless the context indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular implementations, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.g., as in a cause and effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. The present disclosure is directed to a microelectronic assembly with underfill flow control. For example, a microelectronic assembly may comprise a first microelectronic component, a second microelectronic component stacked with the first microelectronic component and at least partly spaced a gap from the first microelectronic component, and a passivation surface disposed on at least one of the first and second components at least within the gap. The passivation layer surface has a first part and at least one second part within the gap and that has materials to cause a different flow of underfill from part to part within the gap. It will be understood that the improved surfaces may be discussed interchangeably as being on different passivation layer parts of a single passivation layer or each surface being of a different or separate passivation layer.

Referring to FIG. 1, a microelectronic assembly 100 being constructed and shown in top view has an upper component 102, such as a die, coupled to a larger lower component 104, such as a package substrate. The components 102 and 104 may be coupled by interconnections 106 such as solder bumps or balls that both electrically and physically couple the upper and lower components together in a gap or volume between the components 102 and 104. A fluid underfill 108 is shown placed on the lower component 104 and flowing into the gap as indicated by the arrows. An initial portion of fluid underfill material (referred to as "the tongue") 110 is dispensed on the lower component proximate to a first edge 112 of the upper component 102. Capillary forces then may draw the fluid underfill 108 into the gap, after which the fluid underfill may set or may otherwise be cured.

However, the arrangement of the interconnections 106 can cause uneven underfill flow between the components that results in voids. For example, the annular spacing between the solder bumps or balls connecting the components 102 and 104 to each other (which is the edge-to-edge distance between interconnections) can be very small and can vary depending on the positions of the interconnections within the gap. Thus, depending on the electrical circuits on the upper and lower components, the annular spacing may be as small as 40 to 21 μm, or even smaller. The annular spacing also is typically varied to be smaller near a center of the upper component 102 compared to the edges 114 and 116 of the upper component when an upper component is a semiconductor chip die for example. The smaller annular spacing increases resistance to flow of the underfill 108. To further increase the resistance, a chip gap height (CGH) is often smaller near a center of the upper component compared to the edges 114 and 116 of the upper component. This structure results in a slower flow of the underfill near the center of the upper component, thereby causing a generally U-shaped underfill front 118, with the center of the flow front 118 lagging the edges of the flow front.

Voids in the underfill can be caused by the uneven front 118. Specifically, the underfill material may be blocked or slowed by the smaller spacing or annular spacing between interconnections 106 and smaller CGH near the center of the upper component 102. Thus, the capillary forces on the underfill 108 are often strongest proximate to the edges 114 and 116 of the upper component 102, and the flow of the fluid underfill 108 may thus be faster proximate to the edges 114 and 116. As the front 118 flows closer to an opposite edge 120 of the upper component, the faster front parts of the flow near the edges 114 and 116 may even meet each other, trapping air ahead of the slower center of the flow front 118 resulting in even more voids in the underfill 108. It has also been found that the larger the difference in CGH at the center of the upper component versus that at the edges of the upper component, the more pronounced the void formation. The presence of underfill voids increases the likelihood of mechanical failures relative to void-free underfill, and may result in a less reliable assembly and component to component connections (or an assembly that must be discarded).

Figure 2:
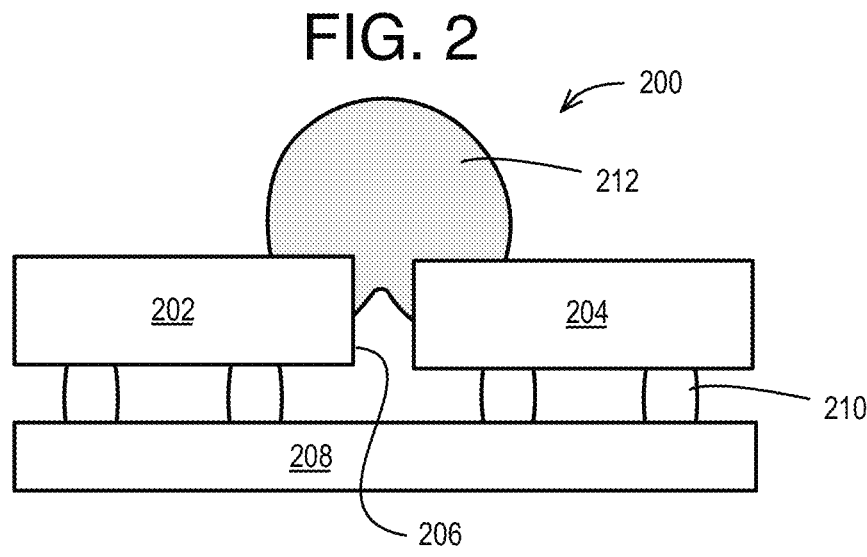
FIGS. 2-4 are schematic diagrams of cross-sectional side views of a microelectronic assembly showing a process of a conventional underfill flow between multiple dice and another electronic component.
Figure 3:
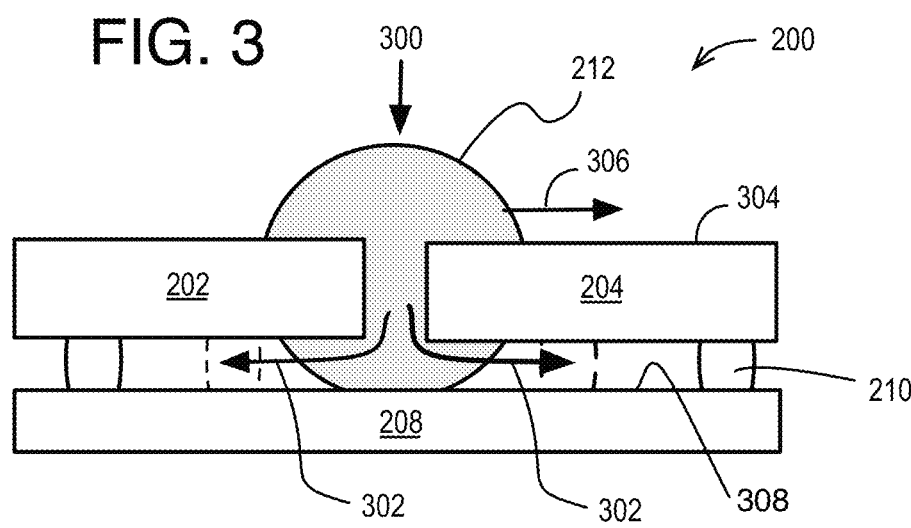
Figure 4:
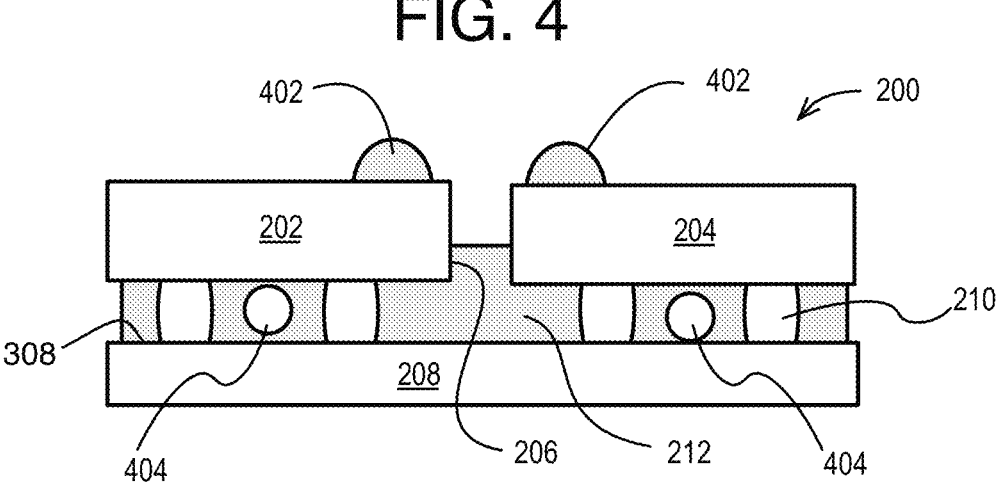

Referring to FIGS. 2-4, the conventional dispensing of the underfill is often between multiple dice on the same general layer at either a wafer or package level. Particularly, a microelectronic assembly 200 may have multiple adjacent dice 202 and 204 with spaces 206 between the dice. The dice 202 and 204 may be upper components mounted on a lower component 208 which is either a package substrate or a much larger wafer in this example. Either construct may support many dice in addition to the two shown. Interconnections 210 may support and electrically connect the upper components 202 and 204 to the lower component 208. An underfill 212 is shown being dispensed on the upper components 202 and 204 and in turn into the space 206 between the components 202 and 204. Initially, gravity and the force of the dispensing moves the underfill 212 into the space 206 as shown by arrow 300 (FIG. 3). Thereafter, however, the spacing 206 between the dice 202 and 204 is sufficiently small so that capillary pressure (arrow 302) then suctions the underfill 212 into the lower part of the space 206 and into a gap 308 in between the upper components 202 and 204 and lower component 208 to generate the underfill flow between the upper and lower components.

Since the underfill flow between upper and lower components is slowed by the annular spacing and CGH in the gap, this causes the underfill material 206 being deposited to remain on a top surface 304 of the upper components 202 and 204 for a duration that is too long. Due to the duration, a strong wetting force 306 is generated on the top surface 304 that can be stronger than the capillary pressure 302 in between 302. The spreading or wetting force 308 causes the underfill material to collect, shown as mounds 402, on the top surface 304, and referred to as epoxy on die when the underfill material is epoxy. Otherwise, the wetting force also may cause significant amounts of the underfill material 206 to flow off of the top surface 304 and onto the lower component 208. Enough underfill material may even flow overflow protection trenches 122 (shown on assembly 100 in FIG. 1) and referred to as an epoxy bleed out.

Such undesired flow of underfill is a waste of material such that a larger and heavier amount of underfill material must be dispensed on the top surface 304 to compensate for this yield loss. The larger amount of material increases costs and the added weight of the underfill can even cause or contribute to warpage of the upper components 202 and 204 that raises the likelihood of mechanical failures and therefore reduces the reliability of the die structures. The warpage also can cause the top surface 304 to slant in a direction that causes more underfill to flow away from the space 206. The wetting diversion of the underfill material to the top surface 304 rather than between the upper and lower components 202/204 and 208 also can contribute to the undesirable formation of voids 404 when an insufficient amount of the underfill is present in the gap 308.

Referring to FIG. 1 again, and in order to compensate for these issues, multiple short dispense line passes are usually used to attempt to reduce the amount and size of flow voids, epoxy on die, and over trench flows. A dispense line is the length of the underfill 212 along the edge 112 of the upper component that forms the tongue 110 of the underfill 108 (as shown in FIG. 1). A short dispense line, and in turn short tongue 126, may be less weight but has a wider spread than a single long dispense line. The single long dispense line, however, takes less time since it is only deposited once. Also, the microelectronic assembly layout and footprints of the components on the assembly also are often placed on a substrate 104 while considering the expected size of the tongue spread. This tongue area 124 is referred to as a keep-out zone (KOZ) where other components, such as dice, other assembly components, or manufacturing implementation tools, cannot be placed on the surface of the substrate to remain clear of the placement and spreading of the underfill. The shorter the dispense line, the more underfill spread of the tongue 126 and more KOZ area 124 is needed, thereby reducing the efficiency of the architecture footprints of the microelectronic assembly.

Otherwise, attempts to mitigate the presence of voids include changing the formula of the underfill material such as to increase surface tension. These formula modification attempts, however, typically often have a negative impact on the thermal performance of the underfill material and/or its adhesion. Specifically, most conventional solutions attempt to optimize the underfill formula to balance among (1) surface tension as the driving force for flow, (2) epoxy wetting characteristics on the surfaces of the electronic assembly, (3) silicon/passivation/solder resist surface structure, and (4) optimization of filler size in the underfill to reduce impact on underfill viscosity and flow speed while maintaining die reliability properties. However, each time the pitch between interconnections is reduced, resulting in smaller annular spacing and/or new silicon interfaces and structures are introduced such as backside metallization, a long development lead time is needed to create a new underfill formula and new manufacturing processes to adequately address a reduction of voids, underfill yield loss, electronic layer warpage, and other downstream impact concerns such as epoxy on-die impacting thermals and final package thermomechanical reliability.

To resolve the issues mentioned above, the present microelectronic assembly is manufactured by using multiple surfaces within a same gap between components of the assembly where one surface has a more hydrophilic material to increase the underfill flow within the gap and another surface has a more hydrophobic material that may maintain a slower flow of underfill within the gap. This may result in a much more even (or straighter) underfill flow front on a leading edge of the underfill as the underfill flows within the gap. By one form, the surface that increases the underfill flow (faster-flow surface) may be disposed wherever the interconnection annular spacing decreases and/or wherever the CGH decreases in the gap and relative to other areas in the gap with a larger CGH and/or larger annular spacing between interconnections. These areas with larger annular spacing or CGH may have the other surface that causes slower underfill flow (slower-flow surface). The more even underfill flow front may reduce void amounts and size within the cured underfill. By one form, the faster-flow surface is found at a more central area of a component or die, while the slower-flow surface may be found nearer the outer edges of the component or die.

Specifically, and in one example form, a microelectronic assembly, comprises a first microelectronic component and a second microelectronic component under an area of the first microelectronic component and coupled to the first component through first interconnect structures within a central region of the area. Second interconnect structures are within a peripheral region of the area, adjacent to the central region. A heterogenous dielectric surface is on the first or second component or both, and within a gap between the first and second components. The heterogenous dielectric surface comprises a first surface composition within the central region and at least a second surface composition within the peripheral region.

By one form, at least one first surface and at least one second surface forming the heterogenous dielectric surface is provided by a passivation layer (or dielectric layer or just dielectric) with at least two parts that each have a different composition or material. The passivation layer part, and in turn surface composition, that is more hydrophilic may be placed in the central area where either the pitch or CGH or both is smaller. The passivation layer is placed on one of the components forming the gap where the passivation layer will contact the underfill once the components are stacked and the underfill is dispensed into the gap. A plasma treatment may be applied to the surface with the faster-flow surface to further increase the rate of the underfill flow.

The reduction of voids by achieving a more even or straighter front of the underfill flow significantly increases the component-to-component connection reliability and mechanical stability of the microelectronic assembly. This arrangement also enables much smaller interconnection pitches and CGHs between components. The underfill may be placed in a gap between dice, or a die and a substrate, interposer, package, or circuit board, or between any of these components when a more even underfill flow front is desired while placing the underfill within the gap.

The increase of the rate of the underfill flow by the disclosed assembly and within the gap will result in more efficient capillary action while dispensing the underfill between adjacent dice, in contrast to the slowing of the underfill shown in FIGS. 2-4 for example, and to direct the underfill into the gap. Such dispensing of the underfill between dice may occur when multiple dice are being supported by a package substrate or a wafer as described herein. This causes a number of additional significant fabrication process improvements. First, this arrangement reduces the amount of underfill needed to be dispensed, or in other words, the weight of the underfill shot, and therefore reduces the cost of the underfill. This also reduces the yield loss or amount of underfill that is typically diverted to flow on the top of the dice or upper components, thereby reducing or eliminating diverted underfill on die (or epoxy on die) and wasted underfill flow to and over the trenches. The reduction in dispense weight of the underfill also may reduce or eliminate warpage that contributes to the underfill diversion and reduction of assembly reliability and mechanical failures.

The reduction in diverted underfill may reduce the equipment purchase requirements and factory floor spacing needs, while reducing the amount of complex flow containment solutions and required KOZ, thereby enabling new architectures such as complex omni-directional interconnect (ODI) architectures, more dice, power delivery capacitors, and other new product form factors that are not possible with larger KOZs.

The reduction in the amount of required underfill also reduces the required tongue size for dispensing the underfill. This permits the use of a single longer dispense line rather than short dispense lines at multiple passes. Thus, first, this may reduce the processing time saved by eliminating multiple passes. Otherwise, however, the use of two materials for two surfaces provided by a passivation layer to be in contact with the underfill also may reduce overall product development timelines since the same underfill and passivation layer may be used for many different structures for microelectronic assemblies, electronic devices, packages, circuit boards, and so forth.

Figure 5A:
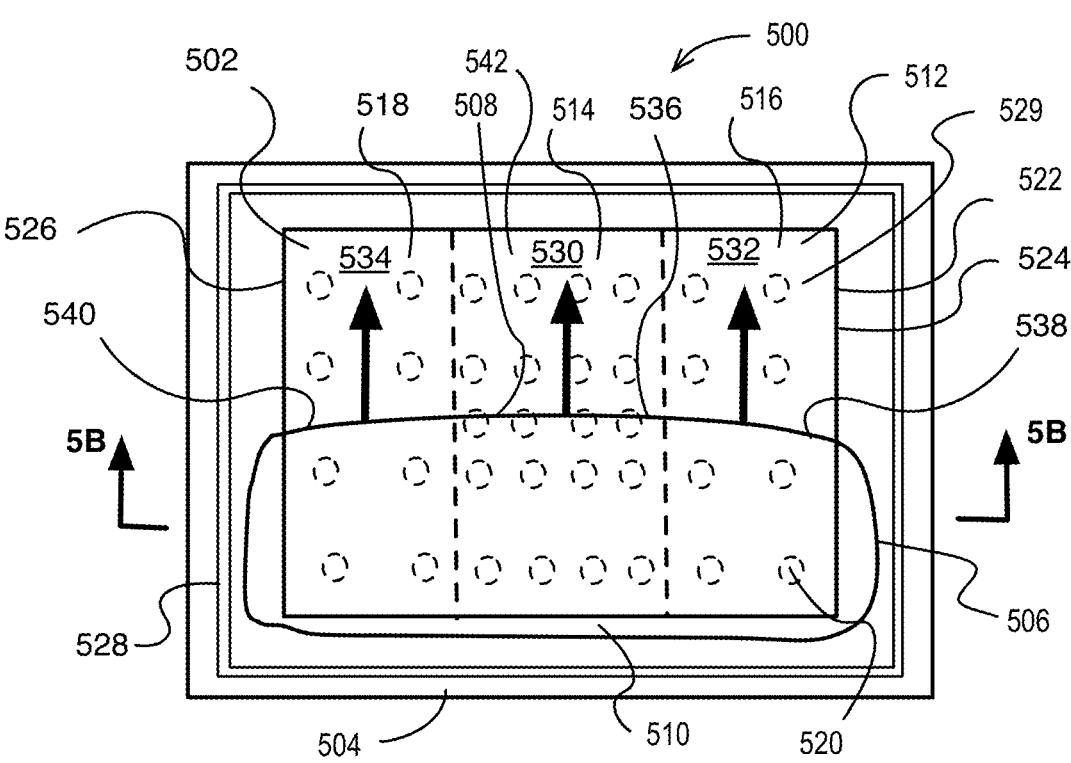
FIG. 5A is a schematic diagram of a top see-through view of a microelectronic assembly with a controlled underfill flow according to at least one of the implementations described herein.
Figure 5B:
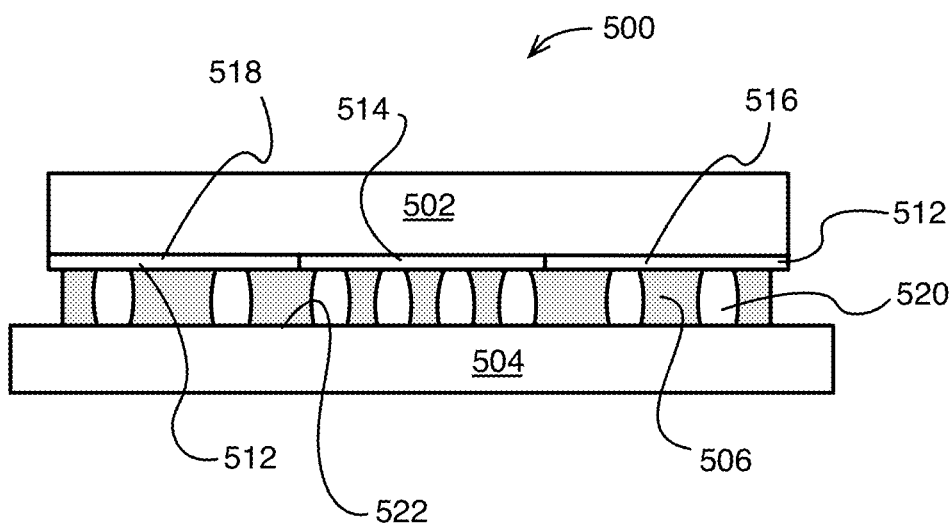
FIG. 5B is a schematic diagram of a cross-sectional side view of the microelectronic assembly of FIG. 5A along line 5B-5B shown on FIG. 5A.

Referring to FIGS. 5A-5B for example, a microelectronic assembly 500 may include an upper component 502 and a lower component 504. The terms "upper" and "lower" as used herein with reference to the upper component 502 and the lower component 504 are used only for clarity, and should not imply any necessary orientation or relative position of the components 502 and 504 unless context indicates otherwise, and is not limited to a vertical stack. The upper and lower components 502 and 504 may be any suitable electronic components. For example, in some implementations, the upper component 502 may be, or may be a part of, a die, a stack of dice, an interposer, a microelectronic device, a package, a circuit board, and so forth, while the lower component 504 may be, or may be part of, a die, a stack of dice, an interposer, a microelectronic device, a microelectronic device substrate, a package, a package substrate, a wafer, a circuit board, and so forth. By one example form used here, the upper component 502 is a die, and the lower component 504 is a package substrate. When the upper or lower components are, or are part of, a microelectronic device, such a device may be any appropriate passive device, including, but not limited to, resistors, capacitors, inductors, and the like, and/or may be any appropriate active device, including, but not limited to, transistors, diodes, microprocessors, chipsets, graphics devices, wireless devices, memory devices, application-specific integrated circuit devices, and the like.

By one example form, the upper component 502 may be a die formed of various dielectric and conductive layers of various materials including Silicon, while the lower component 504 may be a microelectronic substrate that may comprise any appropriate dielectric material, including, but not limited to, liquid crystal polymer, epoxy resin, bismaleimide triazine resin, FR4, polyimide materials, and the like. Various examples of upper and lower components 502 and 504 also are discussed below with reference to FIGS. 6-16.

The lower component 504 may be coupled to the upper component 502 by interconnections (or interconnectors or interconnect structures) 520 (shown in dashed line in FIG. 5A) and disposed within a gap 522 between the upper component 502, and more precisely under the area or footprint of the upper component 502, and a portion of the lower component 504 covered by the upper component 502. The interconnections 520 may physically hold or support the upper component 502 in spaced relation to the lower component 504 to form the gap 522, at least during manufacturing of the microelectronic assembly 500. The interconnections 520 also may electrically connect the components 502 and 504 together. This may involve the use of contacts on the components that are coupled to each other via interconnections 520 such as solder bumps, balls, or pillars of conductive material to form electrical pathways from one component to the other. Otherwise, the components 502 and 504 may be connected via any suitable structures. The interconnections 520 may be used to couple the passive devices, active devices, and/or electrical pathways (e.g., electrical pathways between passive devices, active devices, and the conductive contacts, as desired), and any other desired elements. The upper and lower components 502 and 504 also may include additional conductive contacts (e.g., on a face of the upper or lower component 502 and 504 opposite to the face within the gap 522) not shown. Further elements (e.g., surface-mount devices or other elements, a lid coupled to the lower component 504 via a sealant, etc.), not shown, also may be coupled to the upper or lower components 502 and 504 of a microelectronic assembly 500.

The underfill flow may be controlled by forming a heterogenous dielectric surface 529 with multiple surfaces 530, 532, and 534 within the gap 522 and each having a surface composition or material formed by a part 514, 516, and 518 respectively of a passivation layer 512 in this example. The passivation layer 512 may be formed on the upper or lower component 502 or 504, but in this example is formed on the upper component 502 as shown in FIG. 5B, and will typically be formed on the component that first is mounted with the interconnections. In this example, the center passivation layer part 514 may have a surface 530 with a more hydrophilic surface composition to create a faster underfill flow when the pitch/annular spacing between interconnections 520 is smaller than other areas of the component 502. Two other passivation layer parts 516 and 518 have surfaces 532 and 534 respectively that are formed of a more hydrophobic surface composition compared to the center part surface 530 and are positioned on opposite sides of the center part 514 in this example, and at or nearer outer edges 524 and 526 of the upper component 502.

The underfill 506 may include any suitable material, such as an epoxy material. For example, in some implementations, the underfill 506 may be an epoxy-amine, while in other implementations, the underfill 506 may be an epoxy-anhydride with silica filler particles ranging from 50-70% by weight. By one form, the underfill 506 may be made of a uniform material such that the underfill material is the same throughout the gap 522 so that the underfill material is the same no matter which surface 530, 532, or 534 is adjacent the underfill 506. The underfill 506 may contact the lower component 504 and the upper component 502, as well as the interconnections 520 (or other material or structure coupling the lower component 504 and the upper component 502), as shown. The underfill 506 may include a tongue 510 that represents the location at which the fluid underfill 506 is initially provided before the fluid underfill 506 is wicked into the volume of the gap between the lower component 504 and the upper component 502 by capillary action, as discussed above.

In some implementations, a trench 528 (in FIG. 5A) may be disposed in the face of the lower component 504 to which the upper component 502 is coupled. The trench 528 may be a shallow recess that surrounds the footprint of the upper component 502 and serves as a boundary for the spread of the underfill 506. The footprint of the upper component 502 may not be centered with respect to the footprint of the trench 528. Instead, the trench 528 and the upper component 502 may be dimensioned and relatively positioned to account for the tongue 510 so that more distance exists between the trench and the side face of the upper component 502 proximate to the tongue 510 than proximate to other side faces of upper component 502. In some implementations, no trench 528 may be present.

With this arrangement, the three passivation layer parts 514, 516, and 518 have surface compositions that will cause the underfill 506 dispensed at the tongue 510 to flow between the components 502 and 504 with a much more even front 508 compared to the uneven front 118 of the conventional underfill flow on assembly 100 (FIG. 1). This efficient capillary driven flow is dependent on flow geometry, surface contact angle (or in other words, wettability) with the passivation layer surfaces 530, 532, and 534, surface tension of the underfill material, and viscosity of the underfill material at a dispensing temperature. This relationship can be described, at least in part, by a Young Laplace partial derivative equation (1) to (3) recited below, and that describes the relationship between underfilling driving force, capillary pressure, and the other impacting factors (contact angle, surface tension, and component or die geometry).

$$\Delta P_C = \frac{2\sigma}{\bar{r}}\cos\theta \tag{1}$$

$$\frac{\partial \Delta P_C}{\partial h} = \frac{2\cos\theta}{\bar{r}} \cdot \frac{\partial \sigma}{\partial h} - \left( \frac{2\sigma\sin\theta}{\bar{r}} \cdot \frac{\partial \theta}{\partial h} + \frac{2\sigma\cos\theta}{\bar{r}^2} \cdot \frac{\partial \bar{r}}{\partial h} \right) \tag{2}$$

$$\frac{\partial \Delta P_C}{\partial h}\bigg|_{\sigma,\,\bar{r}} = -\frac{2\sin\theta}{\bar{r}} \cdot \frac{\partial \theta}{\partial h} \tag{3}$$

where $\Delta P_c$ is Laplace pressure, $\sigma$ is surface tension of underfill material at dispense conditions from the passivation layer and a given underfill material, h is a lateral dimension across or perpendicular to the flow direction, $\bar{r}$ is radius of curvature of the front surface of the underfill in the die or flip-chip (C4) area, and $\theta$ is the contact angle between the flowing underfill and the flow control surface the passivation layer of die and solder resist of the substrate.

It has been found that the disclosed arrangement of multiple passivation layer surfaces 530, 532, and 534 in the gap 522 between components 502 and 504 of the assembly 500 can be modified to control the driving force of the underfill flow to form an even (or straighter) underfill flow front 508 by modulating the wetting characteristics (contact angle) across the die (in equation 3 above). The contact angles $\theta$ may be adjusted to achieve the even underfill flow front at the center and edges of the die by speeding up the underfill flow in the center of the component or die area while slowing the flow at the edges of the die. This is done by having the material forming a surface of a part of the passivation layer at the center of the die that is more hydrophilic (or wetting to the underfill) material, while the part of the passivation layer at the edges of the die or component area is more hydrophobic to slow the edge flow relative to the center.

Thus, equation (3) above is used by selecting a material for the surface compositions of a heterogenous dielectric surface of the passivation layer and that has a predetermined contact angle relative to the underfill material that indicates a certain level of Laplace pressure for a given assembly geometry. The smaller the contact angle, which indicates greater Laplace pressure, the higher the rate of underfill flow at that part of the passivation layer.

As to the selection of the particular material to form a hydrophilic surface 530 of the heterogenous dielectric surface 529 of the passivation layer 512, the center part 514 of the passivation layer 512, in this example, may include a material whose proximity to the fluid underfill 506 during manufacturing causes the proximate fluid underfill 506 at the center part 514 to accelerate its capillary flow between the lower component 504 and the upper component 502. In particular, the hydrophilic surface 530 of the passivation layer part 514 may cause the underfill flow to increase at a center section 536 of the underfill flow front 508. The underfill flow rate may be increased at the center section 536 sufficiently so as to substantially equalize the rate of flow between edge flow front sections 538 and 540 on the one hand and the center flow front section 536 on the other, resulting in a more even or straight front 508 that reduces the likelihood of void formation. In some implementations, the surface 530 may have a surface composition that may be arranged to cause the underfill flow at the center section 536 to be faster than the underfill flow rate at the edge sections 538 and 540 on the underfill flow front 508.

In some implementations, the hydrophilic surface composition of the center surface 530 may be selected so as to have a good wetting interaction with the fluid underfill 506, resulting in a local velocity increase of the center section 536 of the flow front 508. In some implementations, the material of the passivation part 514 forming the center surface 530 may cause a relatively low contact angle between the center surface 530 and the underfill 506. For example, in some implementations, the contact angle θ between the center surface 536 of the center part 514 and the underfill 506 may be less than 50 degrees (e.g., less than or equal to 40 degrees). In some implementations, the surface energy of the material of the center surface 536 may be greater than 50 dynes per centimeter (e.g., greater than 56 dynes per centimeter).

Examples of materials that may be used to form the hydrophilic surface 530 of the passivation layer 512 may include SiN, SiO$_2$, and/or WPR. WPR (commercially available from JSR Corp.) is a photosensitive insulation material for microelectronic packaging applications. It is a negative tone, novolac resin material that has a low curing temperature of 190 degrees Celsius, high resolution with an aspect ratio greater than 1, good adhesion for Si$_3$N$_4$ and SiO$_2$, and excellent insulation reliability. The surface composition of the center surface 530 may be formed of a single material (e.g., any of the materials discussed herein), or multiple materials, as desired. The particular materials and/or arrangement of materials may be selected to provide the amount of velocity increase for the underfill flow as desired and at the hydrophilic surface 530 no matter where the hydrophilic surface is to be located on the component 502 including in a pattern formed by the passivation layer 512 with the hydrophilic surface composition of surface 530 in the center area of the component 502 or 504 or at some other location.

With regards to the edges or outer surfaces 532 and 534 of the edge passivation layer parts 516 and 518 respectively, the passivation layer parts 516 and 518 may include a surface composition whose proximity to the fluid underfill 506 during manufacturing causes the proximate fluid underfill 506 to slow its capillary flow between the lower component 504 and the upper component 502. In particular, the presence of the surfaces 532 and 534 may cause the sections 538 and 540 of the flow front 508 of the fluid underfill 506 to slow down relative to the speed of the sections 538 and 540 as if the sections 538 and 540 are without a selected hydrophobic material on the surfaces 532 and 534. The sections 538 and 540 also slow down relative to, or equal to, the speed of the center section 536 of the flow front 508. The result is that a more uniform or even (or straighter) front 508 may be formed thereby reducing the likelihood of void formation.

In some implementations, the surface composition of the passivation layer parts 516 and 518 may be selected so as to have a poor wetting interaction with the fluid underfill 506, resulting in a local velocity reduction of the flow front sections 538 and 540 of the underfill 506. In some implementations, the surface composition of the surfaces 532 and 534 of the passivation layer parts 516 and 518 may have a relatively high contact angle with the underfill 506. For example, in some implementations, the contact angle θ between the surfaces 532 or 534 and the underfill 506 may be greater than 60 degrees (e.g., greater than or equal to 70 degrees). In some implementations, the surface energy of the material of the flow retardant structures 110 may be less than 40 dynes per centimeter (e.g., less than 30 dynes per centimeter).

Examples of materials that may be used to form the hydrophobic surface composition of the passivation layer may include polyimides, benzocyclobutene polymers silicones, polyurethanes, polyolefins, fluorinated elastomers, fluorinated polyolefins, rubber-like materials, or other suitable materials (e.g., materials including silicone particle additives and/or materials using high surface energy treatments). The slower-flow rate passivation layer parts 516 and 518 may be formed of a single material (e.g., any of the materials discussed previously), or multiple materials, as desired, as with the center passivation layer part 514. The particular materials and/or arrangement of materials may be selected to provide the amount of velocity reduction desired in a particular application. In some implementations, any of the passivation layer parts 514, 516, and/or 518 may be formed of a dielectric material.

Referring to FIG. 6, an electronic assembly 600 shows a side of the resulting structure achieved by using the hydrophilic and hydrophobic surfaces described herein. Assembly 600 has upper components 602 and 604 with a space 606 between the two upper components, and a lower component 608 spaced from the upper components 602 and 604 by interconnections 610 described above. The upper components 602 and 604 are dice in this example. The lower component 608, however, could be a package substrate or other component that supports multiple dice, such as a patterned wafer described below. When the lower component is a package substrate, by one approach, a length-wise side of passivation layers 614 and 616 are shown such that both show the same surface composition of the passivation layer part in cross-section (e.g., both show the same surface composition that is either hydrophilic or hydrophobic of the heterogenous dielectric surface of the passivation layers 614 and 616). In other words, this view is 90 degrees to the side cross-sectional view in FIG. 5B. When the lower component 608 is a wafer, the lower component 608 may be patterned with its own passivation layer 618 that aligns with, and extends under, both upper components 602 and 604. This may include providing the surfaces in stripes with the hydrophilic surface between two hydrophobic surfaces also as described below. In either case, the underfill dispensing operations are the same as shown on FIGS. 2-3 where wetting forces at the top of the upper components 602 and 604 will compete with the capillary forces in between the upper and lower components 602/604 and 608. With the use of the hydrophilic and hydrophobic surfaces of the passivation layers 614 or 616 (and of the passivation layers 618 and 620 when a wafer is used), however, capillary forces will be much stronger and the diversion of underfill to the top of the upper components 602 and 604 may be reduced or eliminated as shown. As a result, an underfill 612 is wicked into a gap 618 between the upper and lower components 602/604 and 608 by efficient capillary action to adequately fill the gap 618 with little or no significant voids also as shown.

Referring again to FIG. 5A, a selective plasma treatment 542 may be applied on the upper and/or lower components 502 and 504, and particularly wherever a hydrophilic surface composition is located within the gap 522. Such a plasma cleaning process provides some positive effects on the hydrophilic surface 530 such as removal of surface contaminants and a weak boundary layer, increase in surface energy or wetting enhancement through incorporation of polar groups, and surface roughening to increase the effective surface area and adhesion. The plasma treatment applied to the hydrophilic surface 530 of the passivation layer part 514 anchors new functional groups (for example, C=O, O—C—O, O—C=O, or OH) thereby increasing the concentration of these groups of the surface composition on the hydrophilic surface 530. Since the polar functional groups tend to be hydrophilic in nature, the lower contact angle for a hydrophilic surface, such as a SiN surface, has enhanced or increased wettability after plasma cleaning. Similarly, this same plasma treatment may be applied to the hydrophilic surfaces of both the upper components (or dice) and wafer surface when the lower component is a wafer.

A variety of microelectronic assembly structures are shown with components described above and with varying interconnection patterns to compare the conventional underfill flow to the controlled underfill flow described herein. First referring to FIGS. 7A-7E for example, a microelectronic assembly 700 has an upper component 702, a lower component 704 and a generally uniform pattern of interconnections 706 where the bump pitch is uniform through-out the die (or upper component 702). A reduced CGH also exists at a center of the upper component 702.

A surface of a die 702a being the upper component 702 of assembly 700 is shown (FIG. 7C) with a conventional underfill flow where multiple short dispense lines 712 (FIG. 7B) were used to dispense an underfill 708 on the upper component 702a resulting in the conventional, uneven, curved or U-shaped underfill flow front 710 that tends to creates undesirable voids. Instead, an upper component 702b (FIG. 7E) of assembly 700 has a passivation layer 720 as described above with passivation layer parts including a center part 722 that has a hydrophilic surface composition and two side parts 724 and 726 that have hydrophobic surface compositions. The center part 724 also may be plasma treated to compensate for the reduced CGH effect or smaller pitch. Underfill is dispensed in a long single dispense line 718 (FIG. 7D) resulting in a flowing underfill 714 with a more even (or straighter) flow front 716.

Referring to FIGS. 8A-8E, in this case, the hydrophilic surface is placed where the interconnection pitch is smaller. A microelectronic assembly 800 (FIG. 8A) has the same general cross-section structure as assembly 700 including a small CGH near a center of the upper component 802, except here the interconnection pitch 822 is smaller near the center of the upper component 802 compared to larger interconnection pitch 820 on the outer sides or edges of the upper component 802. A conventional upper component 802a is similar to component 702a except for the center interconnection pitch 822. This causes an even more severe U-shape front 810 of flowing underfill 806 as shown on (or more precisely under) the upper component 802a, and compare to the U-shape of component 702a. Thus, the smaller pitch has caused an even greater slow-down of the underfill in this area of the upper component 802a.

An improved upper component 802b (FIG. 8E) is shown with the disclosed passivation layer parts including a hydrophilic part 826 and hydrophobic side parts 828 and 830 each with a surface composition to control the underfill flow of underfill 814. Otherwise, the component 802b includes the structure and underfill dispensing operations of component 702b including the long single dispense line 818. Here too, the disclosed structure 802b results in a more even (or straighter) underfill flow front 816 that reduces or eliminates voids.

Referring to FIGS. 9A-9E, in this case, a microelectronic assembly 900 is the same or similar to assemblies 700 and 800 except here the pitch between some of the interconnections 906 is so large, relatively speaking, that these are referred to as depleted regions 920 and 922 without interconnections 906. In this case, a conventional upper component 902a is shown with an underfill flow front 910 with the undesirable slowing of the underfill rate at the depleted regions, thereby creating the undesirable U-shaped underfill flow fronts at each depleted region tending to create the damaging voids. The underfill still slows in the depleted region, at least relative to a region with small or usual interconnection pitch, because inter-bump capillary forces usually will increase or enhance flow speed with any pitch smaller than, and relative to, the pitch within depleted regions.

Instead, an upper component 902b (FIG. 9E) with the disclosed passivation layer 924 has a hydrophilic surface 932 or 934 with hydrophilic surface compositions at each depleted region 940 or 942, while the passivation layer parts 926, 928, and 930 have surface compositions that are hydrophobic at the areas with more typical pitch of the interconnections 906. The result is increased capillary flow in the depleted regions 940 and 842, and a much more even or straighter underfill flow front 916 that at least reduces the amount and/or size of undesirable voids. Otherwise, the details of the dispensing or assembly structure not mentioned is the same or similar to that of assembly 700 and 800.

It will be appreciated that the passivation layer parts are not limited to the three parallel column or stripe patterns described herein where the center stripe is hydrophilic and the two side stripes are hydrophobic. By one form, the hydrophilic part and surface may be placed wherever interconnection pitch is smaller than in other regions, or in a depleted region with no interconnections, just as long as the difference between the hydrophilic and hydrophobic surfaces causes a more even or straighter underfill flow front. Thus, the pattern is not necessarily always limited to certain areas of the component face in the gap between the components as long as it is possible to deposit or form the two different passivation layer parts or surfaces on the component in a desired pattern.

Figure 10:
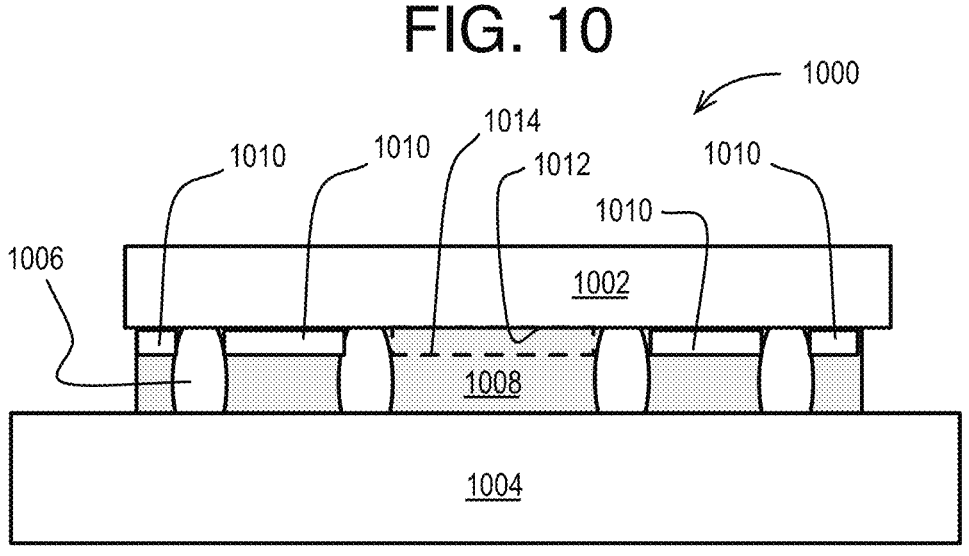
FIG. 10 is a schematic diagram of a cross-sectional side view of an alternative microelectronic assembly to generate underfill flow according to at least one of the implementations described herein.

Referring to FIG. 10, by one alternative microelectronic assembly structure 1000, only one passivation layer part 1010 needs to be added to the component structure already being manufactured. For example, assembly 1000 has an upper component 1002 and a lower component 1004, interconnections 1006, and is shown with underfill 1008 filled in the gap between the upper and lower component 1002 and 1004. In this case, however, no extra passivation layer part is formed on the center area of the components. Instead, a hydrophobic passivation layer part 1010 is placed near the outer edges of the upper component 1002. This arrangement can be used when a lower or bottom surface 1012 of the upper component 1002, such as a die, is already adequately hydrophilic, such as when the hydrophilic surface 1012 facing the gap has a surface composition that is formed of an SiN substrate of the die itself for example. In this case, the hydrophilic surface composition is already provided as part of the main or internal layers of the die as a substrate material by one example. Also in this case, the passivation layer 1010 will be lower than the center surface 1012 of the die. But this can be an advantage by shrinking the CGH where the underfill needs to be slowed at the outer sides of the die 1002. Oppositely, the center of the die may have an added hydrophilic passivation layer 1014 instead of placing a passivation layer part on the outer sides of the component 1002, and when the bottom surface 1012 of the component 1002 is already adequately hydrophobic to slow the underfill flow for example.

Figure 11:
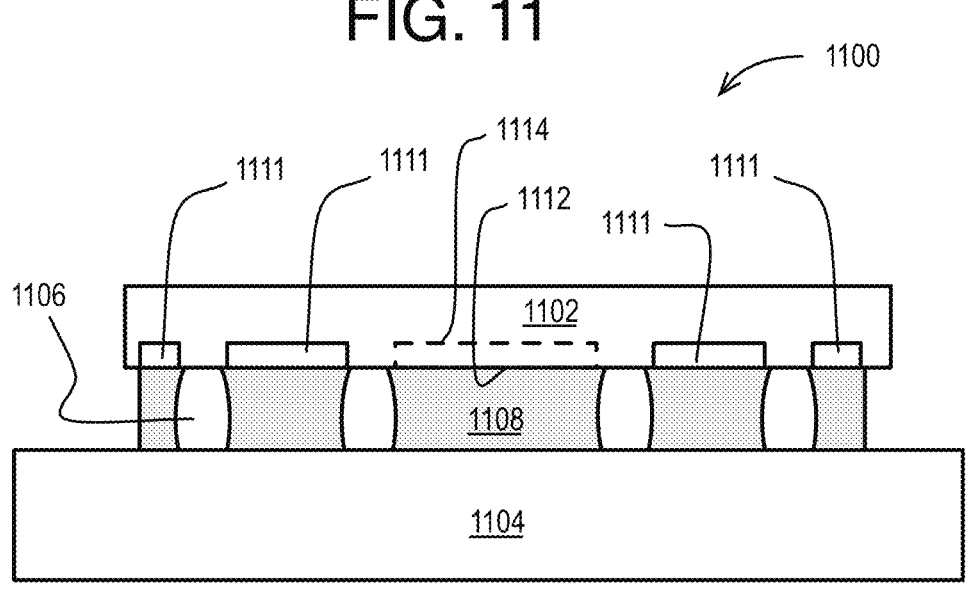
FIG. 11 is a schematic diagram of a cross-sectional side view of another alternative microelectronic assembly to generate underfill flow according to at least one of the implementations described herein.

Referring to FIG. 11, by yet another alternative microelectronic assembly 1100, the structure of assembly 1100 is the same or similar to that of assembly 1000 so that similar pieces are numbered similarly. Here too then, the bottom surface 1112 of the upper component 1102, and here near the center area of the upper component 1102, may already be adequately hydrophilic where pitch or CGH is small, or already adequately hydrophobic where the pitch or CGH is larger. In this alternative example, the bottom layer of the upper component 1102 would be etched and filled, or equivalently processed, to form the passivation layer parts 1111 with surfaces that are at a substantially same height or level as the bottom surface 1112 of the upper component 1102 when the hydrophobic and hydrophilic surfaces facing the gap should be at the same level to maintain sufficient control of the underfill flow to form the desired, even, underfill flow front. Similarly, a center passivation layer 1114 may be placed into the die 1102 when the die's substrate or outer layer already has a sufficient surface for the outer edges rather than the center area of the die 1102.

Figure 12B:
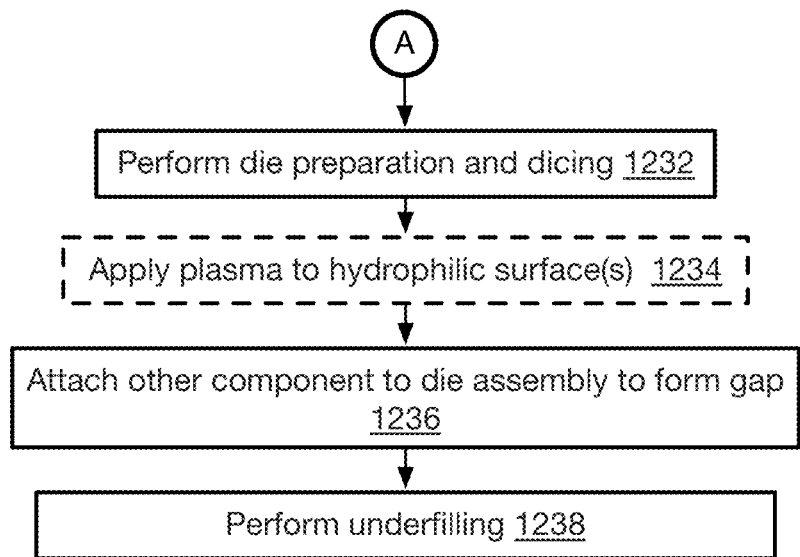

Referring to FIG. 12, an example process 1200 of fabricating a microelectronic assembly with the disclosed underfill flow control surfaces is described with at least operations 1202 to 1238, generally numbered evenly. Process 1200 describes the fabrication of a die assembly that is to be flipped and mounted on a lower component that could be a package substrate or other component that supports multiple flip-chips (or C4s) such as a patterned wafer that also may have the selective passivation with a heterogenous dielectric surface that has varying surface compositions to control underfill flow. Process 1200 may be described while referring to the wafer 1300 (FIG. 13) and intermediate assembly stages of a die assembly 1400 (FIG. 14K) described in FIGS. 14A-14J.

Figure 13:
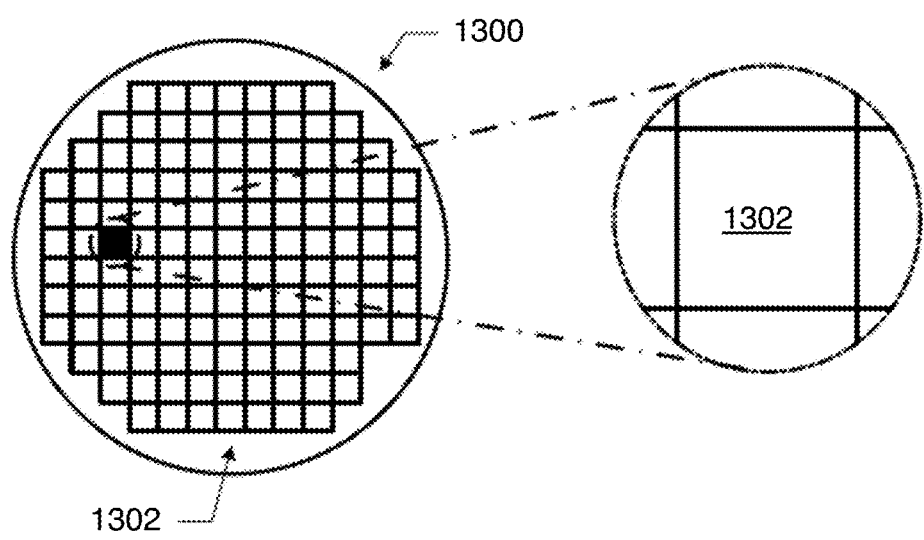
FIG. 13 is a schematic diagram and close-up of a wafer with dice to be used to generate a microelectronic assembly according to at least one of the implementations described herein.

Referring to FIG. 13, process 1200 may include "generate dice on wafer" 1202, and this includes manufacturing dice where any single die from the wafer may be used in any of the assemblies described herein whether the die are to be mounted to a package substrate, a patterned wafer that is different than the wafer the dice are formed on, or other electronic assembly or component thereof. For example, a wafer 1300 has many dice including a die 1302 that may serve as the upper component or the lower component of any of the electronic assemblies disclosed herein. The wafer 1300 may be composed of semiconductor material and may include one or more dice 1302 having integrated circuit (IC) structures formed on a surface of the wafer 1300. Each of the dice 1302 may be a repeating unit of a semiconductor product that includes any suitable IC. After the fabrication of the semiconductor product is complete, the wafer 1300 may undergo a singulation process in which the dice 1302 are separated from one another to provide discrete "chips" of the semiconductor product. This may be performed after the disclosed passivation layers are formed on the die. The die 1302 may include one or more transistors and/or supporting circuitry to route electrical signals to the transistors, as well as any other IC components. In some implementations, the wafer 1300 or the die 1302 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1302. For example, a memory array formed by multiple memory devices may be formed on a same die 1302 as a processing device or other logic that is configured to store information in the memory devices or execute instructions stored in the memory array. These are merely some examples and many others exist.

Figure 14A:
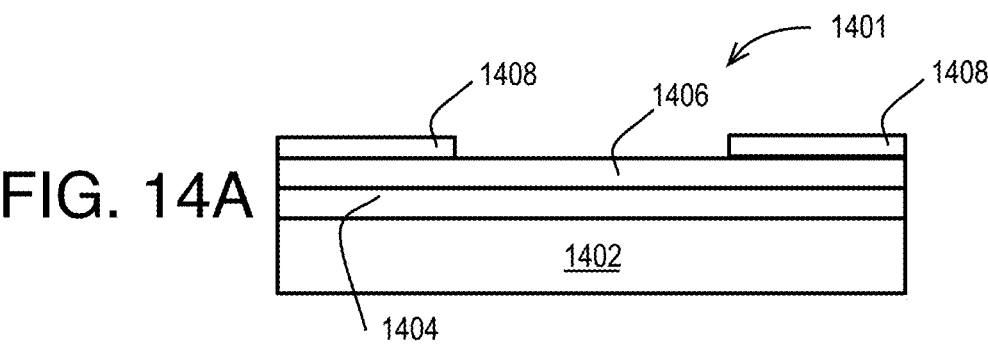
FIGS. 14A-14K are schematic diagrams of cross-sectional side views of fabrication of a microelectronic assembly according to at least one of the implementations described herein.
Figure 14B:
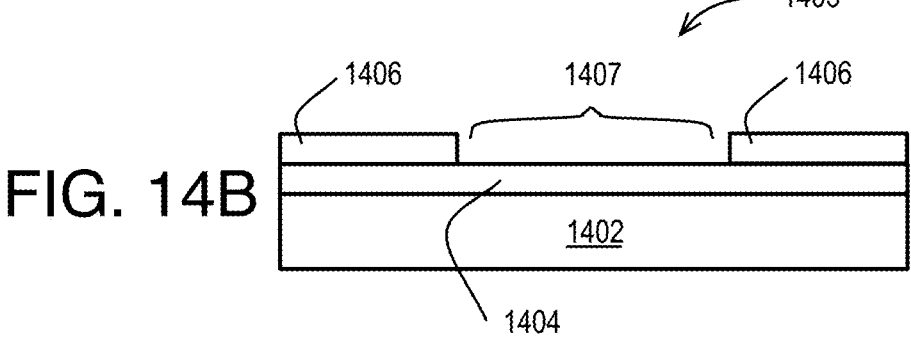

By one form, the passivation (or dielectric) layers are formed before the dice are separated from the wafer. In this example, process 1200 next may include "generate first passivation layer part(s)" 1204 which includes generating the heterogenous dielectric surface of the passivation layer with the hydrophilic and hydrophobic surface compositions. This operation 1204 may first include "deposit passivation layer for first surface" 1206, a first passivation layer may be deposited by atomic layer deposition (ALD), chemical vapor deposition (CVD), physical vapor deposition (PVD), plasma enhanced chemical vapor deposition (PECVD), spin-coating, electrochemical deposition, sputtering, electron beam evaporation, floating transfer and/or dip-casting to name a few examples. By one form, the first passivation layer is about 1 nm to 500 nm thick. The first passivation layer may have a surface composition that may be either hydrophilic or hydrophobic. Referring to FIG. 14A, an example intermediate die assembly structure 1401 shows a die 1402 with the first passivation layer 1404 deposited on the die 1402.

Process 1200 then may include "apply photoresist layer" 1208 and "apply mask and perform lithography" 1210, which are performed by known techniques. A photoresist layer 1406 and masks 1408 are formed on the first passivation layer 1404 (FIG. 14A). In this example, the masks 1408 are spaced from each other to protect outer edge areas (or first surface areas) of the photoresist layer 1406 and first passivation layer 1404 in order to eventually form the first passivation layer as outer hydrophobic passivation layer parts with hydrophobic surface compositions as described herein. Once the masks 1408 are deposited, the assembly 1400 is exposed to light and a portion 1407 of the photoresist layer 1406 between the masks 1408 is removed. This results in the intermediate structure of assembly 1403 shown in FIG. 14B.

Figures 14C, 14D, 14E, 14F, 14G:
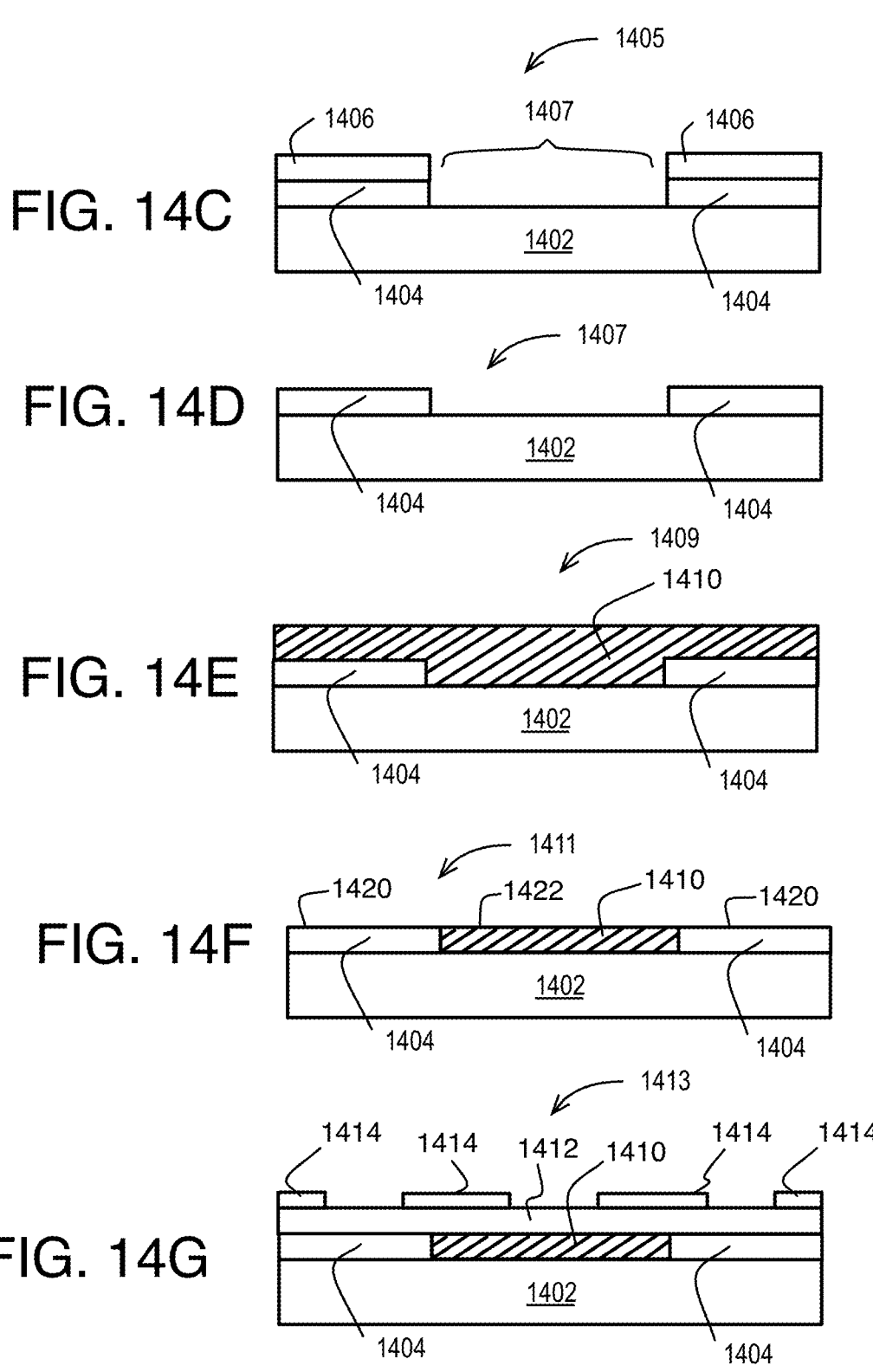
Figure 14H:
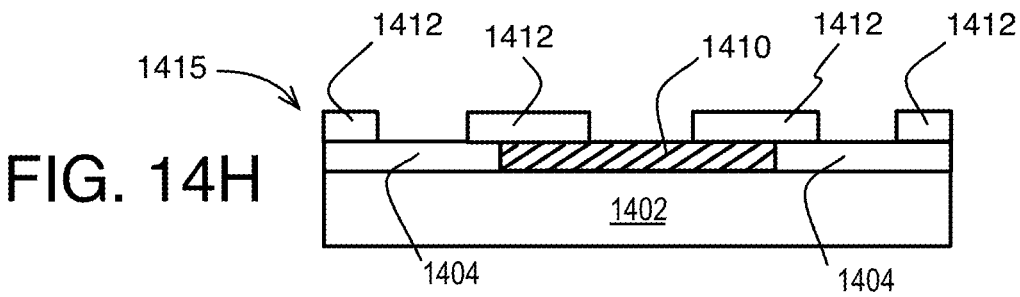

Referring to FIG. 14C, process 1200 next may include "etch area(s) for second surface" 1212, where an intermediate assembly 1405 has the first passivation layer 1404 etched away at the open portion 1407 of the photoresist layer 1406 between the masks 1408 in order to expose an area of the die 1402.

Referring to FIG. 14D, process 1200 then may include "remove masks and photoresist from first surface area" 1214, where the intermediate assembly 1407 shows the masks 1408 are removed, if not done already directly after the lithography, and the remainder of the photoresist layer 1406 at the first passivation area are stripped off of the assembly.

Referring to FIG. 14E, process 1200 may include "generate second passivation layer part(s)" 1216, and this may include "deposit second passivation layer for second surface" 1218, and in order to generate the second passivation layer part with a second surface to be the opposite in wetting characteristics (hydrophobic or hydrophilic) of that of the first surface. An intermediate assembly 1409 has a second passivation layer 1410 shown to be deposited over the exposed area of the substrate 1402 and the first passivation layer parts 1404.

Referring to FIG. 14F, process 1200 may include "etch and CMP to reveal both surfaces and interconnection areas" 1220, where CMP refers to chemical mechanical polish that uses chemical etching and free abrasive polishing to smooth the surfaces of the first and second passivation layers 1404 and 1410 so that their respective surfaces 1420 and 1422 are substantially, or generally, at the same plane as desired and for this example. The surfaces 1420 may have hydrophobic surface compositions while the center surface 1422 may have a hydrophilic surface composition as described above. This is shown on intermediate assembly 1411.

Referring to FIG. 14G, process 1200 may include "generate interconnections" 1222, and this may first include "deposit interconnection photoresist layer" 1224. Intermediate assembly 1413 shows a photoresist layer 1412 deposited on the passivation layer parts 1404 and 1410.

Process 1200 may include "perform masking and lithography" 1226. Here, masks 1414 are formed on the photoresist layer 1412 and placed in spaced relation to each other so that bumps may be formed at areas between the masks 1414. As shown on FIG. 14H, intermediate assembly 1415 has lithography that then may be performed that removes portions of the photoresist layer 1412 between the masks 1414, and the masks 1414 then may be removed as well thereby leaving photoresist layer portions 1412 between the locations that will have the interconnections (interconnection structures, bumps, or other such structures).

Figure 14I:
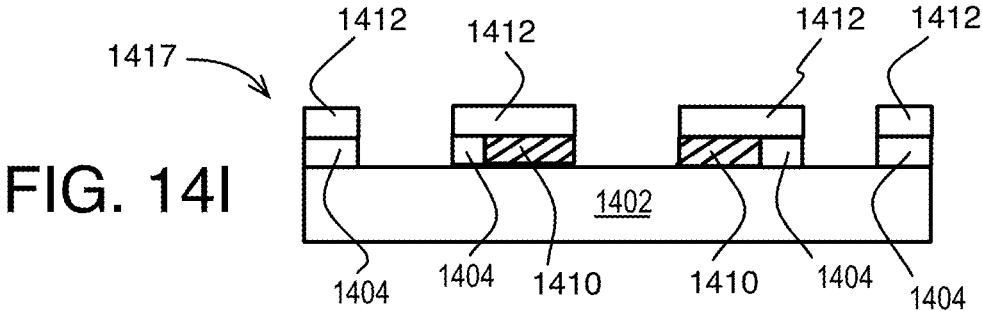
Figure 14J:
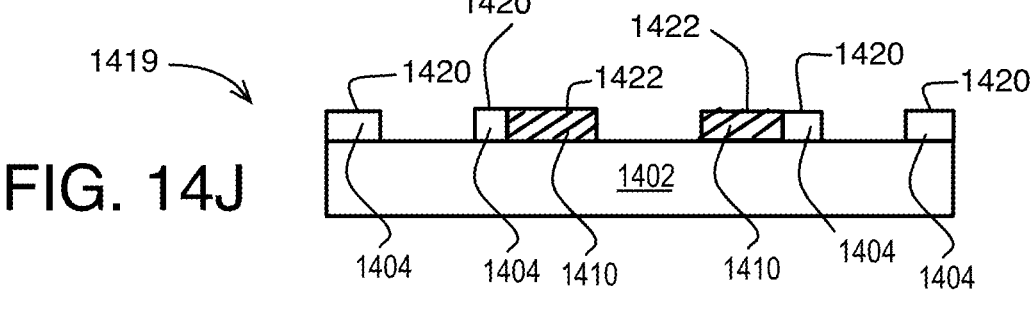

Referring to the intermediate assembly 1417 of FIG. 14I, process 1200 may include "etch through passivation layer parts" 1228 where the portions of the passivation layer parts 1404 and 1410 are etched away within or between the photoresist layer portions 1412 so that the substrate 1402 is exposed and ready for construction of the interconnections. As shown intermediate assembly 1419 on FIG. 14J, this operation also may include then stripping the remainder of the photoresist layer 1412 from the assembly 1400. The remaining structure 1419 exposes the underfill controlling surfaces 1420 and 1422 of the passivation layer parts 1404 and 1410 and with hydrophilic and hydrophobic surface compositions respectively as described above. The intermediate assembly 1419 also show the passivation layer parts

1404 and 1410 with spaces or holes between them to have the interconnection structures.

Figure 14K:
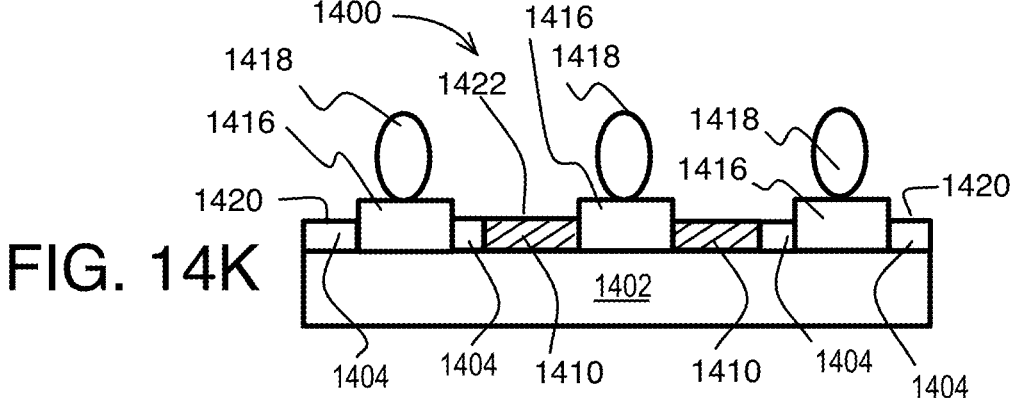

Referring to FIG. 14K, process 1200 may include "deposit barrier layer and bumps" 1230. This may include depositing a barrier layer cap or contact 416, which may be Ti, and within the open spaces within or between the passivation layer parts 1404 and 1410. Then bumps 1418 may be generated by performing Cu and Sn plating for example.

Process 1200 may include "perform die preparation and dicing" 1232, where the die are prepared and then separated from each other and the wafer by known techniques. For example laser scribe followed by dicing (or singulation) is performed to produce individual dice.

Figure 15:
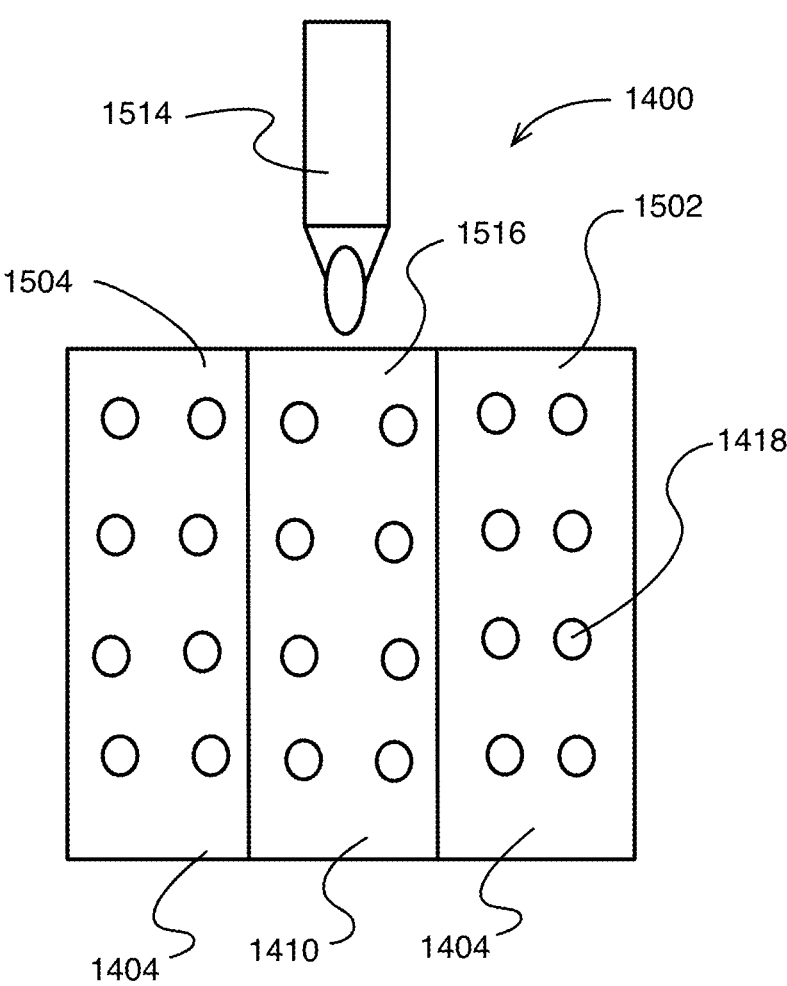
FIG. 15 is a schematic diagram of a bottom view of a passivation layer of a microelectronic assembly and application of a plasma treatment according to at least one of the implementations described herein.

Referring to FIG. 15, process 1200 optionally may include "apply plasma to hydrophilic surface(s)" 1234, and where a plasma treatment may be applied to the hydrophilic surface 1516 of the hydrophilic passivation layer part 1410, and between two side hydrophobic passivation layer parts 1404 that form a total passivation layer 1502 of assembly 1400. As mentioned above, the plasma treatment will increase polar group concentration in the surface composition of the hydrophilic passivation layer part 1410 to further increase wetting and in turn the underfill flow rate at the hydrophilic passivation layer part 1410. The passivation layer part 1410 is shown undergoing plasma application by an atmospheric pressure plasma jet (APPJ) 1514 via a low temperature atmospheric plasma jetting process using any combination of gas including cleaned air, $N_2$, $O_2$, and an $N_2$ and $H_2$ mixture 1514.

Thereafter, process 1200 may include "attach other component to die assembly to form gap" 1236 the die assembly 1400 is ready for mounting on lower component such a package substrate, or patterned wafer by one example, by attaching the interconnections 1418 to conductive caps on the lower component. This is performed by known techniques such as thermocompression bonding (TCB) or mass reflow (MR) die attach.

Process 1200 then may include "perform underfilling" 1238 where the gap between the die assembly and lower component then may be filled with dispensed underfill according to the capillary force implementations with hydrophilic and hydrophobic surfaces in the gap as described herein. It will be appreciated that process 1200 is one example process for forming multiple underfill flow controlling passivation layer portions within a gap between components of a microelectronic assembly, and many variations are contemplated.

Figure 16A:
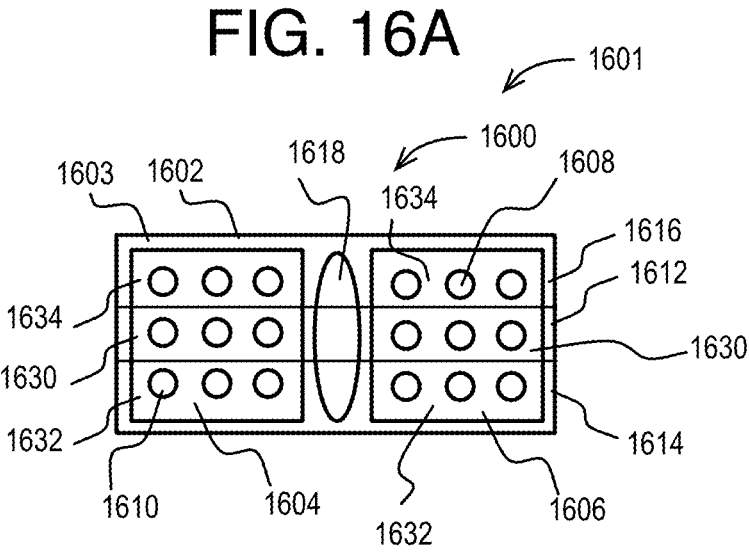
FIGS. 16A-16C are schematic diagrams of top see through views showing stages of underfill flow between dice mounted on a wafer according to at least one of the implementations described herein.
Figure 16B:
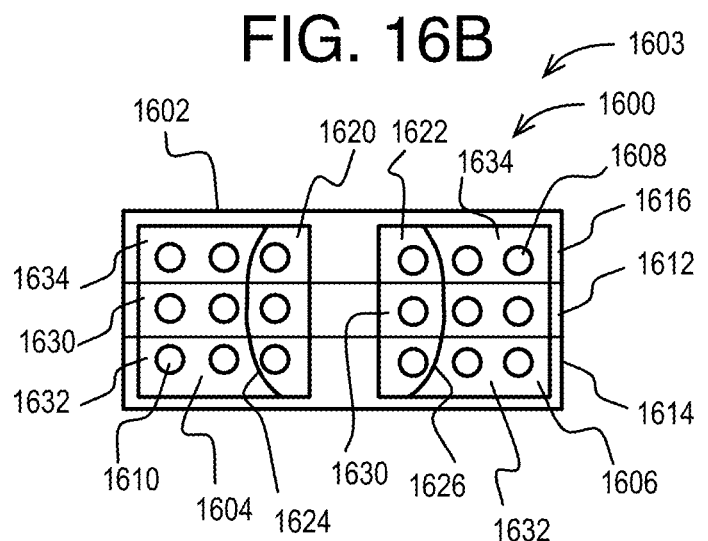
Figure 16C:
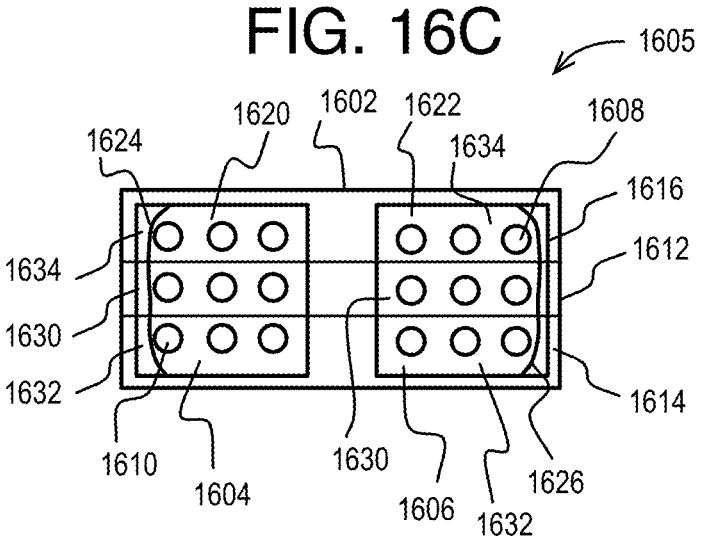

Referring to FIGS. 16A-16C, an underfill flow process is shown in sequence and top view by the figures and on an alternative electronic assembly 1600. As mentioned, process 1200 may be used to construct dice for an alternative electronic assembly 1600 with a lower component 1602 that is a wafer coupled to multiple upper components or dice 1604 and 1606 (shown in see-through view). Such a wafer 1602 may hold 100s or more such dice 1604 and 1606, and the dice 1604 and 1606 may be connected to the wafer in at least one row or column, or many rows and columns. The wafer 1602 may have an upper or top dielectric layer interconnected to the dice 1604 and 1606. In this example, the dice 1604 and 1606 are shown with interconnections 1610 and 1608 respectively with the wafer 1602 and that hold the dice 1604 and 1606 in a spaced relation from the wafer 1602 to form a gap between the dice 1604 and 1606 on one side of the gap and the wafer 1602 on the other (similar to FIG. 6).

The wafer 1602 also may be patterned for selective passivation in the form of a passivation layer that has a heterogenous dielectric surface 1603 with multiple passivation layer parts with corresponding multiple surfaces of varying surface compositions. By one approach, a surface 1612 has a surface composition that is hydrophilic and surfaces 1614 and 1616 that have a hydrophobic surface composition to control the underfill flow front as described herein. The wafer 1602 may have its surfaces 1612, 1614, and 1616 be patterned to align with the surfaces 1630, 1632, and 1634 of varying underfill controlling compositions of the dice. By one approach, the wafer surfaces 1612, 1614, and 1616 are provided in stripes with the hydrophilic surface 1612 between two hydrophobic surfaces 1614 and 1616 to align with a similar parallel pattern of stripes on the dice 1604 and 1606. The dice 1604 and 1606 have the three surfaces including a center hydrophilic surface 1630 and edge surfaces 1632 and 1634. In this arrangement, surfaces 1630, 1632, and 1634 respectively face surfaces 1612, 1614, and 1616 on the wafer, and in one form, substantially face each other directly while being separated from each other by the gap between the dice 1604 and 1606 to be ready to receive the underfill within the gap.

As to dispensing and flowing an underfill, an underfill flowing stage 1601 (FIG. 16A) shows a dispense line of underfill 1618 dispensed on the wafer 1602 and between dice 1604 and 1606. The underfill may have been dispensed similarly to that explained in FIGS. 2-3 above.

Referring to FIG. 16B, an underfill flowing stage 1603 shows that capillary pressure (or other driving force) has moved or flowed now expanding underfill portions 1620 and 1622 respectively into the gaps between the dice 1606 and 1604 on one side and the wafer 1602 on the other. It is shown that respective underfill flow fronts 1624 and 1626 of the underfill portions 1620 and 1622 are convex with a center extending more outward than the edges in the flow direction in the gap under each die 1602 and 1604 to avoid void formation.

Referring to FIG. 16C, an underfill flowing stage 1605 shows that the underfill portions 1620 and 1622 have expanded to mostly fill the gap and the underfill flow fronts 1624 and 1626 are each much more even or straighter than the conventional U-shaped or convex front that would have occurred without at least some of the underfill flowing control surfaces 1612, 1614, 1616, 1630, 1632, and 1634. This reduces the size and/or amount of voids within the underfill in the gap.

Figure 16D:
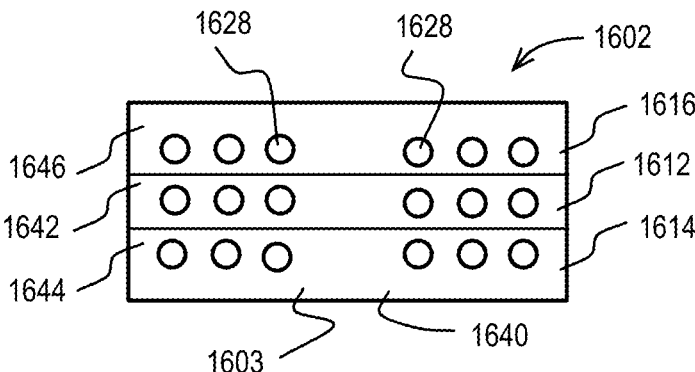
FIGS. 16D-16F is a schematic flow diagram to show manufacturing of an electronic assembly with dice being placed on a wafer to generate underfill flow according to at least one of the implementations described herein.

Referring to FIG. 16D, in order to manufacture the electronic assembly 1600, a wafer 1602 is obtained and may be a different wafer than that used to generate the dice, but need not always be. The wafer 1602 may be formed with a dielectric layer (or passivation layer) 1640 that is exposed to the receive dice. The passivation layer 1640 may be deposited in stripes or other patterns forming passivation layer parts 1642, 1644, 1646, where the passivation layer 1640 has a heterogenous dielectric surface with the surfaces 1612, 1614, and 1616 respectively of passivation layer parts 1642, 1644, and 1646. The surface composition of surface 1612 is formed to be hydrophilic while the surface composition of surfaces 1614 and 1616 are formed to be hydrophobic. While the three stripe pattern is shown with the hydrophilic composition in the center, other patterns could be used such as only two stripes with the two different compositions, or many alternating stripes, or other non-stripe patterns, such as concentric, zigzagging, and so forth. The wafer 1602 may be patterned continuously in generally parallel stripes or other patterns across the wafer surface 1603 between dice positions, and across multiple dice positions where the wafer is to be interconnected to a die. Conductive caps 1628 also may be formed on the wafer 1602 to interconnect to the dice 1604 and 1606. The wafer 1602 including the passivation or dielectric layer and conductive caps is constructed the same or similarly to that of the process 1200.

Figure 16E:
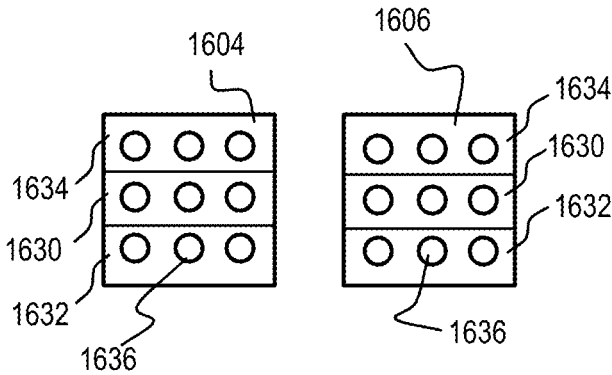

Referring to FIG. 16E, dice 1604 and 1606 are shown ready to be coupled to the wafer 1602. The surfaces 1630, 1632, and 1634 of the dice 1604 and 1606 are formed by the process 1200, and here in a striped pattern to align with the stripes on wafer 1602 as already described. The dice 1604 and 1606 are shown with interconnections 1636, such as pillars, solder balls, or bumps to be attached to the conductive caps on the wafer 1602.

By one form, the widths and position of the underfill controlling surfaces of the stripes or other pattern are substantially or exactly aligned between the wafer and the dice where the edges of the stripes on the wafer and dice are at the same plane perpendicular or substantially perpendicular to the planar faces of the wafer and dice. Otherwise, the underfill controlling surfaces of the wafer and dice are generally aligned such that the surfaces are sufficiently at least overlapping to generate an underfill flow front that adequately reduces void amount and/or size within the cured underfill. It will be appreciated that these arrangements may be used when the lower component is other than a wafer as well.

By yet other arrangements, the surfaces of similar composition on the upper and lower components (whether a wafer or another type of component) may at least partly overlap or may not overlap at all, such as with a spaced or alternating pattern. For example, the lower component may have a center stripe of hydrophilic material while the upper component may have edge stripes of hydrophobic material. By another option, opposite compositions may be placed over each other or overlap on the opposite sides of the gap where the lower component may have a center stripe of hydrophilic composition while the center stripe of the upper component may be of hydrophobic material, and the opposite may be positioned at the edge stripes. Many variations are contemplated.

Figure 16F:
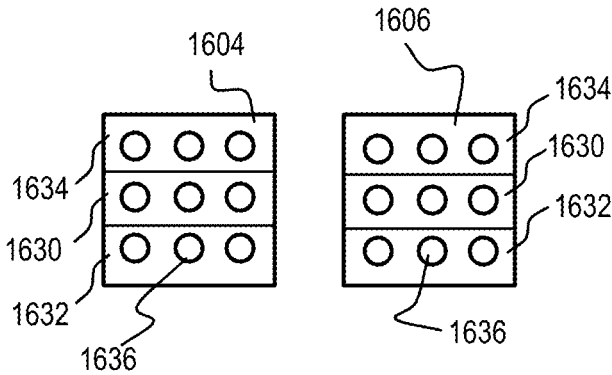

Referring to FIG. 16F, the assembled electronic assembly 1600 shows the dice 1604 and 1606 flipped and then mounted on the wafer 1602 (or vice-versa) so that the underfill flow patterns align with the surfaces of the same or similar material, such as hydrophilic or hydrophobic, and while facing the interior of the gap to contact underfill to be placed in the gap.

Tests were performed on microelectronic assemblies to demonstrate the feasibility of the diverse wetting by multiple surfaces of a passivation layer. Die stacks were built using a hammer (worst chip to chip height outside an acceptable assembly processing range that is expected to fail 100%) CGH difference from center to edge of the dice and that is larger difference in CGH than that actually used. Only the center surfaces were plasma treated for both a die side and a patch side prior to TCB using an APPJ process. Underfilling results post CSAM image review showed a 100% reduction in void rate compared to known process of record (POR) conditions of 16.7% to 37.5% respectively.

Figure 17:
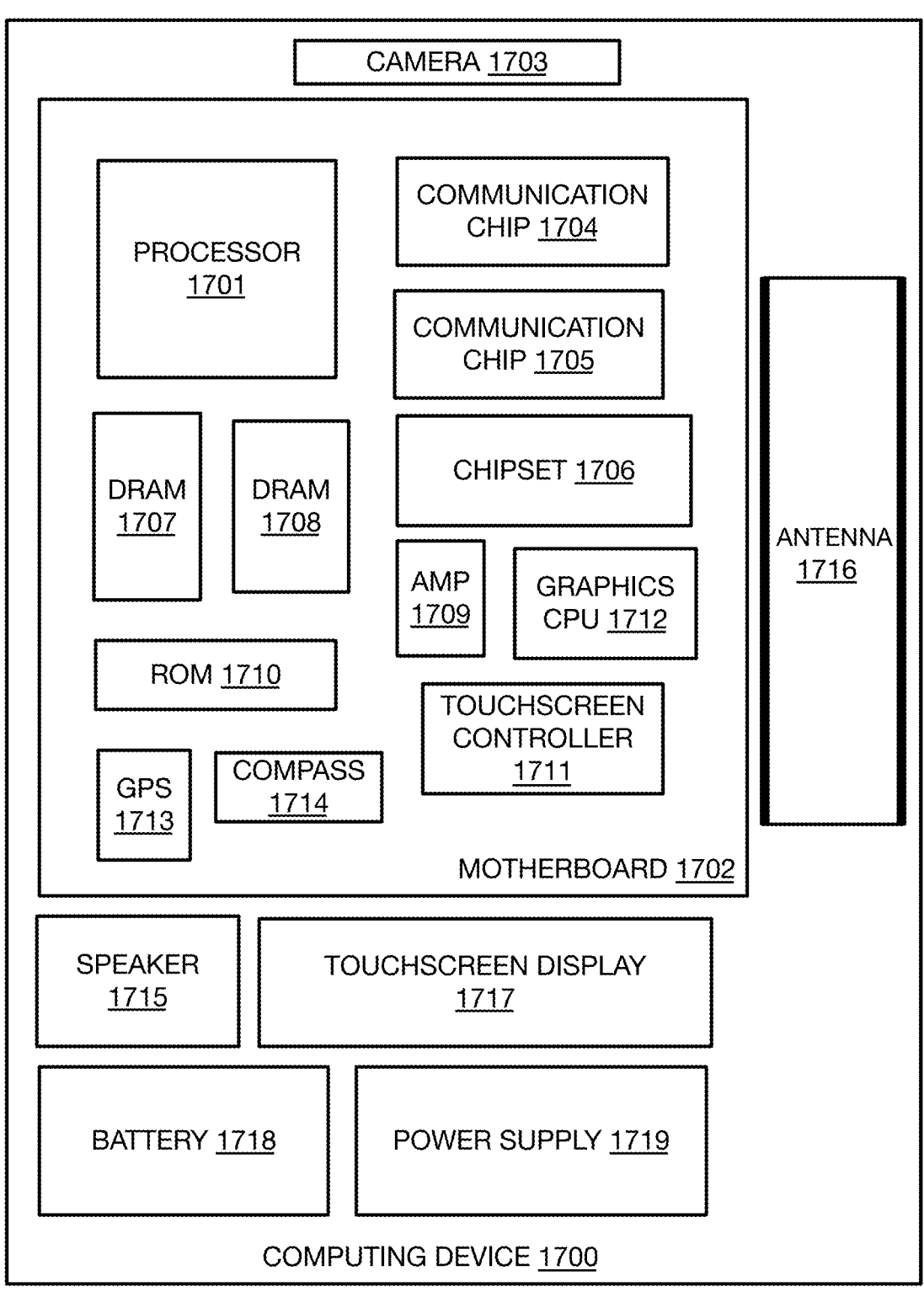
FIG. 17 is a functional schematic diagram of a computing device, all arranged in accordance with at least some implementations of the present disclosure.

Referring to FIG. 17, a computing device 1700 is arranged in accordance with at least some implementations of the present disclosure. Computing device 1700 may have any of the microelectronic assemblies found above, for example, and further includes a motherboard 1702 hosting a number of components, such as but not limited to a processor 1701 (e.g., an applications processor) and one or more communications chips 1704, 1705. Processor 1701 may be physically and/or electrically coupled to the motherboard 1702. In some examples, processor 1701 includes an integrated circuit die packaged within the processor 1701. In general, the term "processor" may refer to any device or portion of a device that processes electronic data from registers and/or memory to transform that electronic data into other electronic data that may be stored in registers and/or memory. Any one or more device or component of computing device 1700 may include a die or device having any 3D die stack and/or related characteristics as discussed herein. In various examples, the one or more communication chips 1704, 1705 also may be physically and/or electrically coupled to the motherboard 1702. In further implementations, communication chips 1704 may be part of processor 1701. Depending on its applications, computing device 1700 may include other components that may or may not be physically and electrically coupled to motherboard 1702. These other components may include, but are not limited to, volatile memory (e.g., DRAM) 1707, 1708, non-volatile memory (e.g., ROM) 1710, a graphics processor 1712, global positioning system (GPS) device 1713, compass 1714, a chipset 1706, an antenna 1716, a power amplifier 1709, a touchscreen controller 1711, a touchscreen display 1717, a speaker 1715, a camera 1703, a battery 1718, and a power supply 1719, as illustrated, and other components such as a digital signal processor, a crypto processor, an audio codec, a video codec, an accelerometer, a gyroscope, flash memory, and a mass storage device (such as hard disk drive, solid state drive (SSD), compact disk (CD), digital versatile disk (DVD), and so forth), or the like.

Communication chips 1704, 1705 may enable wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1704, 1705 may implement any of a number of wireless standards or protocols, including but not limited to those described elsewhere herein. As discussed, computing device 1700 may include a plurality of communication chips 1704, 1705. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1719 may convert a source power from a source voltage to one or more voltages employed by other devices of mobile computing platform 1100. In some embodiments, power supply 1719 converts an AC power to DC power. In some embodiments, power supply 1719 converts an DC power to DC power at one or more different (lower) voltages. In some embodiments, multiple power supplies are staged to convert from AC to DC and then from DC at a higher voltage to DC at a lower voltage as specified by components of computing device 1700.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It is understood that the subject matter of the present description is not necessarily limited to specific applications illustrated in FIGS. 1-17. The subject matter may be applied to other microelectronic devices and assembly applications, as well as any appropriate electronic application, as will be understood to those skilled in the art.

The following examples pertain to further implementations. Specifics in the examples may be used anywhere in one or more implementations.

In Example 1, a microelectronic assembly, comprising a first microelectronic component; a second microelectronic component under an area of the first microelectronic component and coupled to the first component through first interconnect structures within a central region of the area, and second interconnect structures within a peripheral region of the area, adjacent to the central region; and a heterogenous dielectric surface on the first or second component or both and within a gap between the first and second components, wherein the heterogenous dielectric surface comprises a first surface composition within the central region and at least a second surface composition within the peripheral region.

In Example 2, the subject matter of Example 1 can optionally include the first surface composition is more hydrophilic than the second surface composition.

In Example 3, the subject matter of Example 1 or 2 can optionally include the first and second surface compositions have different contact angles with an underfill to be placed within the gap.

In Example 4, the subject matter of any of Examples 1 to 3 can optionally include the first surface composition has a different flow driving force against an underfill to be placed within the gap than at the second surface composition.

In Example 5, the subject matter of any of Examples 1 to 4 can optionally include the first surface composition is arranged to flow an underfill faster within the gap than the second surface composition.

In Example 6, the subject matter of Example 5 can optionally include the central region comprises a stripe extending a longitudinal length of the first or second component, and wherein the peripheral region is on two sides of the central region.

In Example 7, the subject matter of any of Examples 1 to 6 can optionally include the material of the first surface composition comprises at least one of: SiN, novolac resin, $SiO_2$, and any combination of these.

In Example 8, the subject matter of any of Examples 1 to 7 can optionally include the material of the second surface composition comprises a polyimide.

In Example 9, the subject matter of any of Examples 1 to 8 can optionally include the first surface composition is located where the pitch between the first interconnection structures within the gap is smaller than the pitch at the second interconnection structures within the gap.

In Example 10, the subject matter of any of Examples 1 to 9 can optionally comprise a gap height between the first and second microelectronic components that is smaller at the first surface composition than the gap height at the second surface composition.

In Example 11, the subject matter of any of Examples 1 to 10 can optionally include the heterogenous dielectric surface is an outer surface of a passivation layer on the first microelectronic component.

In Example 12, the subject matter of any of Examples 1 to 11 can optionally include the first microelectronic component is at least one electronic die and the second micro-electronic component is a wafer, and wherein the heterogenous dielectric surface facing the gap is provided on both the first and second components.

In Example 13, a method of fabricating a microelectronic assembly, comprising forming a heterogenous dielectric surface on a first microelectronic component comprising forming a first surface composition and at least a second surface composition; and coupling the second component under an area of the first component and coupled through first interconnect structures within a central region of the area and second interconnect structures within a peripheral region of the area adjacent to the central region so that the first surface composition is located at the central region and the second surface composition is located at the peripheral region.

In Example 14, the subject matter of Example 13 can optionally comprise flowing underfill within the gap and in contact with the first and second surface compositions so that the underfill flows differently on the first and second surface compositions In Example 15, the subject matter of any of Example 13 or 14 can optionally include the first surface composition is more hydrophilic than the second surface composition.

In Example 16, the subject matter of any of Examples 13 to 15 can optionally comprise flowing the underfill at different rates at the first and second surface compositions so that a flow front of the underfill is straighter as the underfill flows along the central and peripheral regions compared to underfill flowing on a single surface composition.

In Example 17, the subject matter of any of Examples 13 to 16 can optionally comprise forming the central region as a stripe extending a longitudinal length of the first or second component; and forming the second surface composition at the peripheral region on two sides of the central region.

In Example 18, the subject matter of any of Examples 13 to 17 can optionally comprise forming alternating composition surface locations within the gap depending on the pitch of the first interconnection structures compared to the pitch of the second interconnection structures within the gap.

In Example 19, the subject matter of any of Examples 13 to 18 can optionally comprise forming a passivation layer on the first microelectronic component to form the first and second composition surfaces to be located within the gap.

In Example 20, the subject matter of any of Examples 13 to 18 can optionally comprise the first component is a die with an outer layer with one of the first or second composition surfaces, and the method comprising depositing a passivation layer forming only one of the other of the first or second composition surfaces adjacent to the first composition surface.

In Example 21, the subject matter of any of Examples 13 to 20 can optionally comprise applying a plasma treatment to increase a concentration of polar groups at the first surface composition that is more hydrophilic than the second surface composition.

In Example 22, an electronic system, comprising a board; and a microelectronic package attached to the board, wherein the microelectronic package comprises a first microelectronic component; a second microelectronic component under an area of the first microelectronic component and coupled to the first component through first interconnect structures within a central region of the area, and second interconnect structures within a peripheral region of the area, adjacent to the central region; and a heterogenous dielectric surface on the first or second component and within a gap between the first and second components, wherein the heterogenous dielectric surface comprises a first surface composition within the central region and at least a second surface composition within the peripheral region In Example 23, the subject matter of any of Examples 1 to 8 can optionally include at least one of: (1) a pitch of the first interconnection structures is smaller than a pitch of the second interconnection structures, and (2) a gap height between the first and second components is smaller at the first surface composition than a gap height at the second surface composition.

In Example 24, the subject matter of any of Examples 1 to 8 can optionally comprise a depleted area of the first component without interconnections to the second component, and the first surface composition is more hydrophilic than the other surface composition and is located at the depleted area.

In Example 25, the subject matter of any of Examples 1 to 8 can optionally include at least one of: both the first and second components are each a die, one of the first and second components is a die and the other component is a substrate, multiple first components are each a die and the second component is a wafer, and at least one of the first and second components is a circuit board.

It will be recognized that the disclosures herein are not limited to the implementations so described, but can be practiced with modification and alteration without departing from the scope of the appended claims. For example, the above implementations may include specific combination of features. However, the above implementations are not limited in this regard and, in various implementations, the above implementations may include undertaking only a subset of such features, undertaking a different order of such features, undertaking a different combination of such features, and/or undertaking additional features than those features explicitly listed. The scope of the assemblies, devices, and methods disclosed herein should, therefore, be determined with reference to the appended claims, along with the full scope of equivalents to which such claims are entitled.

What is claimed is:

1. A microelectronic assembly, comprising:
a first microelectronic component;
a second microelectronic component under an area of the first microelectronic component and coupled to the first microelectronic component through first interconnect structures within a central region of the area, and second interconnect structures within a peripheral region of the area, adjacent to the central region; and
a heterogenous dielectric surface on the first or second microelectronic component or both and within a gap between the first and second microelectronic components, wherein the heterogenous dielectric surface comprises a first surface composition within the central region and at least a second surface composition within the peripheral region.

2. The microelectronic assembly of claim 1, wherein the first surface composition is more hydrophilic than the second surface composition.

3. The microelectronic assembly of claim 1, wherein the first and second surface compositions have different contact angles with an underfill to be placed within the gap.

4. The microelectronic assembly of claim 1, wherein the first surface composition has a different flow driving force against an underfill to be placed within the gap than at the second surface composition.

5. The microelectronic assembly of claim 1, wherein the first surface composition is arranged to flow an underfill faster within the gap than the second surface composition.

6. The microelectronic assembly of claim 5, wherein the central region comprises a stripe extending a longitudinal length of the first or second microelectronic component, and wherein the peripheral region is on two sides of the central region.

7. The microelectronic assembly of claim 1, wherein the first surface composition comprises at least one of: SiN, novolac resin, $SiO_2$, and any combination of these.

8. The microelectronic assembly of claim 1, wherein the material of the second surface composition comprises a polyimide.

9. The microelectronic assembly of claim 1, wherein the first surface composition is located where the pitch between the first interconnection structures within the gap is smaller than the pitch at the second interconnection structures within the gap.

10. The microelectronic assembly of claim 1, comprising a gap height between the first and second microelectronic components that is smaller at the first surface composition than the gap height at the second surface composition.

11. The microelectronic assembly of claim 1, wherein the heterogenous dielectric surface is an outer surface of a passivation layer on the first microelectronic component.

12. The microelectronic assembly of claim 1, wherein the first microelectronic component is at least one electronic die and the second microelectronic component is a wafer, and wherein the heterogenous dielectric surface facing the gap is provided on both the first and second microelectronic components.

13. A method of fabricating a microelectronic assembly, comprising:

forming a heterogenous dielectric surface on a first microelectronic component comprising forming a first surface composition and at least a second surface composition; and coupling a second component under an area of the first microelectronic component through first interconnect structures within a central region of the area and second interconnect structures within a peripheral region of the area adjacent to the central region so that the first surface composition is located at the central region and the second surface composition is located at the peripheral region.

14. The method of claim 13, comprising flowing underfill within a gap between the first and second components and in contact with the first and second surface compositions so that the underfill flows differently on the first and second surface compositions.

15. The method of claim 13, wherein the first surface composition is more hydrophilic than the second surface composition.

16. The method of claim 14, comprising flowing the underfill at different rates at the first and second surface compositions so that a flow front of the underfill is straighter as the underfill flows along the central and peripheral regions compared to underfill flowing on a single surface composition.

17. The method of claim 13, comprising forming the central region as a stripe extending a longitudinal length of the first or second microelectronic component, and forming the second surface composition at the peripheral region on two sides of the central region.

18. The method of claim 14, comprising forming alternating composition surface locations within the gap depending on the pitch of the first interconnection structures compared to the pitch of the second interconnection structures within the gap.

19. The method of claim 14, comprising forming a passivation layer on the first microelectronic component to form the first and second composition surfaces to be located within the gap.

20. The method of claim 13, wherein the first microelectronic component is a die with an outer layer with one of the first or second composition surfaces, and the method comprising depositing a passivation layer forming only one of the other of the first or second composition surfaces adjacent to the first composition surface.

21. The method of claim 13, comprising applying a plasma treatment to increase a concentration of polar groups at the first surface composition that is more hydrophilic than the second surface composition.

22. An electronic system, comprising:

a board; and a microelectronic package attached to the board, wherein the microelectronic package comprises:

a first microelectronic component;

a second microelectronic component under an area of the first microelectronic component and coupled to the first microelectronic component through first interconnect structures within a central region of the area, and second interconnect structures within a peripheral region of the area, adjacent to the central region; and a heterogenous dielectric surface on the first or second microelectronic component and within a gap between the first and second microelectronic components, wherein the heterogenous dielectric surface comprises a first surface composition within the central region and at least a second surface composition within the peripheral region.

23. The electronic system of claim 22, wherein at least one of: (1) a pitch of the first interconnection structures is smaller than a pitch of the second interconnection structures, and (2) a gap height between the first and second microelectronic components is smaller at the first surface composition than a gap height at the second surface composition.

24. The electronic system of claim 22, comprising a depleted area of the first microelectronic component without interconnections to the second microelectronic component, and the first surface composition is more hydrophilic than the other surface composition and is located at the depleted area.

25. The electronic system of claim 22, wherein at least one of:

both the first and second microelectronic components are each a die, one of the first and second microelectronic components is a die and the other microelectronic component is a substrate, multiple first microelectronic components are each a die and the second microelectronic component is a wafer, and at least one of the first and second microelectronic components is a circuit board.

\* \* \* \* \*